(12) United States Patent
Kao

(10) Patent No.: US 8,603,575 B1
(45) Date of Patent: Dec. 10, 2013

(54) THIN-FILM ABSORBER FORMATION METHOD

(75) Inventor: Sam Kao, Los Altos, CA (US)

(73) Assignee: Nanosolar, Inc., San Jose, CA (US)

( * ) Notice: Subject to any disclaimer, the term of this patent is extended or adjusted under 35 U.S.C. 154(b) by 0 days.

(21) Appl. No.: 13/267,867

(22) Filed: Oct. 6, 2011

Related U.S. Application Data

(60) Provisional application No. 61/390,610, filed on Oct. 6, 2010.

(51) Int. Cl.
*C23C 16/00* (2006.01)

(52) U.S. Cl.
USPC ............... 427/162; 427/248.1; 427/255.23

(58) Field of Classification Search
USPC .................. 427/162, 248.1, 255.23
See application file for complete search history.

(56) References Cited

U.S. PATENT DOCUMENTS

| 2006/0004229 A1* | 1/2006 | Dieterle et al. | 562/527 |
| 2008/0214014 A1* | 9/2008 | Ranish et al. | 438/758 |
| 2009/0305449 A1* | 12/2009 | Bollman et al. | 438/57 |

OTHER PUBLICATIONS

Palm, J., et al., "CIS module pilot processing applying concurrent rapid selenization and sulfurization of large area thin film precursors". Thin Solid Films, 431-432 (2003) 514-522.*

Bekker, J., et al. "Properties of CuIn(Se,S)2 thin films prepared by two-step growth processes". Thin solid Films 431-432 (2003_116-121.*

* cited by examiner

*Primary Examiner* — Bret Chen
(74) *Attorney, Agent, or Firm* — Joshua D. Isenberg; JDI Patent

(57) ABSTRACT

A thin-film absorber formation method includes: operating a furnace having an internal atmosphere containing a process gas; loading process gas material into a source container that is part of a system configured to provide process gas to the furnace, wherein loading of the source container occurs without exposing the internal atmosphere of the furnace to external atmosphere present in the source container by solidifying process gas material to form a gas tight seal to separate the source container from the furnace, wherein the seal is formed before the source container is opened for loading and external atmosphere enters the source container, including a pathway configured to retain process gas material in a section of the pathway to solidify and create the seal.

15 Claims, 20 Drawing Sheets

THIN-FILM ABSORBER FORMATION METHOD

CROSS-REFERENCE TO RELATED APPLICATION

This application claims priority to U.S. Provisional Application Ser. No. 61/390,610 filed Oct. 6, 2010. This application is fully incorporated herein by reference for all purposes.

FIELD OF THE INVENTION

This invention relates to solar cells and more specifically to fabrication of solar cells that use active layers based on IB-IIIA-VIA compounds.

BACKGROUND OF THE INVENTION

Solar cells and solar modules convert sunlight into electricity. These electronic devices have been traditionally fabricated using silicon (Si) as a light-absorbing, semiconducting material in a relatively expensive production process. To make solar cells more economically viable, solar cell device architectures have been developed that can inexpensively make use of thin-film, light-absorbing semiconductor materials such as, but not limited to, copper-indium-gallium-sulfo-di-selenide, $Cu(In, Ga)(S, Se)_2$, also termed CI(G)S(S). This class of solar cells typically has a p-type absorber layer sandwiched between a back electrode layer and an n-type junction partner layer. The back electrode layer is often Mo, while the junction partner is often CdS. A transparent conductive oxide (TCO) such as, but not limited to, zinc oxide ($ZnO_x$) is formed on the junction partner layer and is typically used as a transparent electrode. CIS-based solar cells have been demonstrated to have power conversion efficiencies exceeding 19%.

A central challenge in cost-effectively constructing a large-area CIGS-based solar cell or module is that the elements of the CIGS layer should be within a narrow stoichiometric ratio on nano-, meso-, and macroscopic length scale in all three dimensions in order for the resulting cell or module to be highly efficient. Achieving precise stoichiometric composition over relatively large substrate areas is, however, difficult using traditional vacuum-based deposition processes. For example, it is difficult to deposit compounds and/or alloys containing more than one element by sputtering or evaporation. Both techniques rely on deposition approaches that are limited to line-of-sight and limited-area sources, tending to result in poor surface coverage. Line-of-sight trajectories and limited-area sources can result in non-uniform three-dimensional distribution of the elements in all three dimensions and/or poor film-thickness uniformity over large areas. These non-uniformities can occur over the nano-, meso-, and/or macroscopic scales. Such non-uniformity also alters the local stoichiometric ratios of the absorber layer, decreasing the potential power conversion efficiency of the complete cell or module.

Alternatives to traditional vacuum-based deposition techniques have been developed. In particular, production of solar cells on flexible substrates using non-vacuum, semiconductor printing technologies provides a highly cost-efficient alternative to conventional vacuum-deposited solar cells. For example, T. Arita and coworkers [20th IEEE PV Specialists Conference, 1988, page 1650] described a non-vacuum, screen printing technique that involved mixing and milling pure Cu, In and Se powders in the compositional ratio of 1:1:2 and forming a screen printable paste, screen printing the paste on a substrate, and annealing this film to form the compound layer. They reported that although they had started with elemental Cu, In and Se powders, after the milling step the paste contained the $CuInSe_2$ phase. However, solar cells fabricated from the annealed layers had very low efficiencies because the structural and electronic quality of these absorbers was poor.

Screen-printed $CuInSe_2$ deposited in a thin-film was also reported by A. Vervaet et al. [9th European Communities PV Solar Energy Conference, 1989, page 480], where a micron-sized $CuInSe_2$ powder was used along with micron-sized Se powder to prepare a screen printable paste. Layers formed by non-vacuum, screen printing were annealed at high temperature. A difficulty in this approach was finding an appropriate fluxing agent for dense $CuInSe_2$ film formation. Even though solar cells made in this manner had poor conversion efficiencies, the use of printing and other non-vacuum techniques to create solar cells remains promising.

Others have tried using chalcogenide powders as precursor material, e.g. micron-sized CIS powders deposited via screen-printing, amorphous quaternary selenide nanopowder or a mixture of amorphous binary selenide nanopowders deposited via spraying on a hot substrate, and other examples [(1) Vervaet, A. et al., E. C. Photovoltaic Sol. Energy Conf., Proc. Int. Conf., 10th (1991), 900-3; (2) Journal of Electronic Materials, Vol. 27, No. 5, 1998, p. 433; Ginley et al.; (3) WO 99,378,32; Ginley et al.; (4) U.S. Pat. No. 6,126,740]. So far, no promising results have been obtained when using chalcogenide powders for fast processing to form CIGS thin-films suitable for solar cells.

Due to high temperatures and/or long processing times required for annealing, formation of a IB-IIIA-chalcogenide compound film suitable for thin-film solar cells is challenging when starting from IB-IIIA-chalcogenide powders where each individual particle contains appreciable amounts of all IB, IIIA, and VIA elements involved, typically close to the stoichiometry of the final IB-IIIA-chalcogenide compound film. Poor uniformity was evident by a wide range of heterogeneous layer features, including but not limited to porous layer structure, voids, gaps, cracking, and regions of relatively low-density. This non-uniformity is exacerbated by the complicated sequence of phase transformations undergone during the formation of CIGS crystals from precursor materials. In particular, multiple phases forming in discrete areas of the nascent absorber film will also lead to increased non-uniformity and ultimately poor device performance.

The requirement for fast processing then leads to the use of high temperatures, which would damage temperature-sensitive foils used in roll-to-roll processing. Indeed, temperature-sensitive substrates limit the maximum temperature that can be used for processing a precursor layer into CIS or CIGS to a level that is typically well below the melting point of the ternary or quaternary selenide (>900° C.). A fast and high-temperature process, therefore, is less preferred. Both time and temperature restrictions, therefore, have not yet resulted in promising results on suitable substrates using ternary or quaternary selenides as starting materials.

As an alternative, starting materials may be based on a mixture of binary selenides, which at a temperature above 500° C. would result in the formation of a liquid phase that would enlarge the contact area between the initially solid powders and, thereby, accelerate the annealing process as compared to an all-solid process. Unfortunately, below 500° C. no liquid phase is created.

Thus, there is a need in the art for a one-step, rapid yet low-temperature technique for fabricating high-quality and uniform CIGS films for solar modules and suitable precursor materials for fabricating such films.

SUMMARY OF THE INVENTION

The disadvantages associated with the prior art are overcome by embodiments of the present invention directed to the introduction of IB and IIIA elements in the form of chalcogenide nanopowders and combining these chalcogenide nanopowders with an additional source of chalcogen such as selenium or sulfur, tellurium or a mixture of two or more of these, to form a group IB-IIIA-chalcogenide compound. According to one embodiment a compound film may be formed from a mixture of: 1) binary or multi-nary selenides, sulfides, or tellurides and 2) elemental selenium, sulfur or tellurium. According to another embodiment, the compound film may be formed using core-shell nanoparticles having core nanoparticles containing group IB and/or group IIIA elements coated with a non-oxygen chalcogen material. In yet another embodiment of the present invention, the chalcogen may also be deposited with the precursor material and not in a separate, discrete layer.

In one embodiment of the present invention, a thin-film absorber formation method is provided. The method may include forming a precursor layer on a substrate, wherein the precursor layer comprises one or more discrete layers; and processing the precursor layer in one or more steps to form a thin-film absorber layer, wherein one of the steps includes heating in a group VIA-based environment.

It should be understood that embodiments of the present invention may be adapted to have one or more of the feature herein. In one nonlimiting example, a first layer of the one or more discrete layers is formed over a second layer. Optionally, the forming step occurs by creating vapor from a solid feedstock, wherein solid to vapor creation occurs within a reduced height processing section. Optionally, the solid feedstock is on a continually moving carrier web. Optionally, the solid feedstock is at a distance such that vapor formed is condensed onto a substrate opposite the feedstock. Optionally, the substrate is at a temperature below a temperature required to vaporize the feedstock. Optionally, the substrate is already coated with one or more precursor layers. Optionally, the substrate is at least 0.5 meter wide. Optionally, the substrate is at least 1 meter wide. Optionally, embodiments herein may further include using a condenser to recapture group VIA material in the vapor that is not deposited. Optionally, the condenser is coupled to a vent or inlet close to the processing zone where group VIA gas is used. Optionally, the condenser is coupled to a vent or inlet within to the processing zone where group VIA gas is used. Optionally, the condenser comprises of a multi-stage condenser with at least a first condensing stage and at least a second condensing stage. Optionally, the condenser comprises of a multi-stage condenser with ceramic fiber material therein. Optionally, the condenser comprises has a first stage configured to remove more than 50% of group VIA material from outgassed vapor and a second stage that removes an amount so that at least 95% of original VIA material is removed after two stages. Optionally, the embodiment herein may include using a muffle wherein heaters are spaced apart from the muffle by an air gap and not in direct contact with the muffle. Optionally, group VIA material being deposited is sulfur-based. Optionally, group VIA material is deposited and heated at a reduced height portion of relative to other portions of the processing system. Optionally, group VIA material vapor is present, the processing system has a reduced height portion of relative to other portions of the processing system. Optionally, the reduced height portion is no more than half of interior chamber portions before or after the reduced height portion. Optionally, the reduced height portion is no more than 0.9 of interior chamber height of portions before or after the reduced height portion. Optionally, the reduced height portion is no more than 0.75 of interior chamber height of portions before or after the reduced height portion. Optionally, the reduced height portion is no more than half of exterior chamber portions before or after the reduced height portion. Optionally, the reduced height portion is no more than 0.9 of exterior chamber height of portions before or after the reduced height portion. Optionally, the reduced height portion is no more than 0.75 of exterior chamber height of portions before or after the reduced height portion.

In another embodiment of the present invention, a thin-film absorber formation method is provided comprising: operating a furnace having an internal atmosphere containing a process gas; loading process gas material into a source container that is part of a system configured to provide process gas to the furnace, wherein loading of the source container occurs without exposing the internal atmosphere of the furnace to external atmosphere present in the source container by solidifying process gas material to form a gas tight seal to separate the source container from the furnace, wherein the seal is formed before the source container is opened for loading and external atmosphere enters the source container.

It should be understood that embodiments of the present invention may be adapted to have one or more of the feature herein. In the example, the method may include purging the external atmosphere from the source container; liquefying the process gas material forming the gas tight seal to re-open a fluid pathway leading to the furnace. Optionally, the process gas material is in solid form when loaded into the source container. Optionally, the source container is coupled to a system that converts process gas material to a vapor which is then transported to the furnace. Optionally, the method includes continuing to process a workpiece in the furnace while simultaneously loading process gas material into the source container, wherein such loading of the source container does not interrupt the furnace from processing the work piece. Optionally, a shaped pathway is configured to retain process gas material in a section of the pathway to solidify and create the seal. Optionally, the method includes retaining process gas material in a trap portion downstream from the source container to form the seal when the process gas material is solidified. Optionally, the method includes flowing material downward from the source container into a pathway having a first portion and a second portion, wherein the second portion is configure to provide resistance to flow out from the first portion, thus retaining process gas material in the first portion to solidify and form the seal. Optionally, the second portion is angled to direct flow against gravity. Optionally, the second portion is shaped to retain process gas material in the first portion. Optionally, the process gas material solidified in the pathway has an effective amount of pathway-to-solid material contact surface to form a gas tight seal. Optionally, the source container includes heaters for liquefying the process gas material. Optionally, the source container further comprising heaters in downstream pathway for liquefying the process gas material forming the gas tight seal to re-open a fluid pathway leading to the furnace. Optionally, the process gas is corrosive to polymers. Optionally, the method includes forming the gas seal without using any other means, except for solidifying process gas material in the pathway. Optionally, the method includes forming the gas seal without using a mechanical valve.

A further understanding of the nature and advantages of the invention will become apparent by reference to the remaining portions of the specification and drawings.

DESCRIPTION OF THE SPECIFIC EMBODIMENTS

Figure 1A:
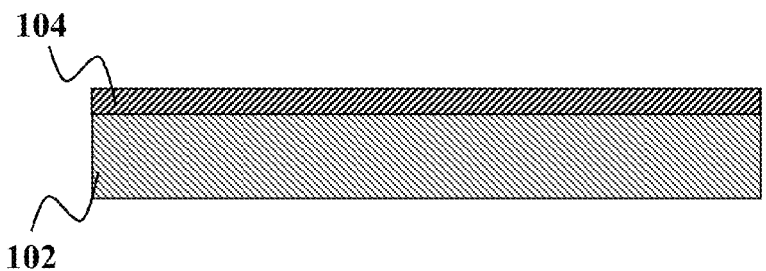
FIGS. 1A-1E are a sequence of schematic cross-sectional diagrams illustrating fabrication of a photovoltaic active layer according to an embodiment of the present invention.

It is to be understood that both the foregoing general description and the following detailed description are exemplary and explanatory only and are not restrictive of the invention, as claimed. It may be noted that, as used in the specification and the appended claims, the singular forms "a", "an" and "the" include plural referents unless the context clearly dictates otherwise. Thus, for example, reference to "a material" may include mixtures of materials, reference to "a compound" may include multiple compounds, and the like. References cited herein are hereby incorporated by reference in their entirety, except to the extent that they conflict with teachings explicitly set forth in this specification.

In this specification and in the claims which follow, reference will be made to a number of terms which shall be defined to have the following meanings:

"Optional" or "optionally" means that the subsequently described circumstance may or may not occur, so that the description includes instances where the circumstance occurs and instances where it does not. For example, if a device optionally contains a feature for a barrier film, this means that the barrier film feature may or may not be present, and, thus, the description includes both structures wherein a device possesses the barrier film feature and structures wherein the barrier film feature is not present.

According to one embodiment of the present invention, an active layer for a photovoltaic device may be fabricated by first forming a group IB-IIIA compound layer, disposing a group VIA particulate on the compound layer and then heating the compound layer and group VIA particulate to form a group IB-IIIA-VIA compound. Preferably, the group IB-IIIA compound layer is a compound of copper (Cu), indium (In) and Gallium (Ga) of the form $Cu_zIn_xGa_{1-x}$, where $0 \leq x \leq 1$ and $0.5 \leq z \leq 1.5$. The group IB-IIIA-VIA compound preferably is a compound of Cu, In, Ga and selenium (Se) or sulfur S of the form $CuIn_{(1-x)}Ga_xS_{2(1-y)}Se_{2y}$, where $0 \leq x \leq 1$ and $0 \leq y \leq 1$. It should also be understood that the resulting group IB-IIIA-VIA compound may be a compound of Cu, In, Ga and selenium (Se) or sulfur S of the form $Cu_zIn_{(1-x)}Ga_xS_{2(1-y)}Se_{2y}$, where $0.5 \leq z \leq 1.5$, $0 \leq x \leq 1.0$ and $0 \leq y \leq 1.0$.

It should also be understood that group IB, IIIA, and VIA elements other than Cu, In, Ga, Se, and S may be included in the description of the IB-IIIA-VIA alloys described herein, and that the use of a hyphen ("-" e.g., in Cu—Se or Cu—In—Se) does not indicate a compound, but rather indicates a coexisting mixture of the elements joined by the hyphen. It is also understood that group IB is sometimes referred to as group 11, group IIIA is sometimes referred to as group 13 and group VIA is sometimes referred to as group 16. Furthermore, elements of group VIA (16) are sometimes referred to as chalcogens. Where several elements can be combined with or substituted for each other, such as In and Ga, or Se, and S, in embodiments of the present invention, it is not uncommon in this art to include in a set of parentheses those elements that can be combined or interchanged, such as (In, Ga) or (Se, S). The descriptions in this specification sometimes use this convenience. Finally, also for convenience, the elements are discussed with their commonly accepted chemical symbols. Group IB elements suitable for use in the method of this invention include copper (Cu), silver (Ag), and gold (Au). Preferably the group IB element is copper (Cu). Group IIIA elements suitable for use in the method of this invention include gallium (Ga), indium (In), aluminum (Al), and thallium (Tl). Preferably the group IIIA element is gallium (Ga) or indium (In). Group VIA elements of interest include selenium (Se), sulfur (S), and tellurium (Te), and preferably the group VIA element is either Se and/or S.

According to a first embodiment of the present invention, the compound layer may include one or more group IB elements and two or more different group IIIA elements as shown in FIGS. 1A-1E.

The absorber layer may be formed on a substrate 102, as shown in FIG. 1A. By way of the example, the substrate 102 may be made of a metal such as, but not limited to, aluminum. Depending on the material of the substrate 102, it may be useful to coat a surface of the substrate with a contact layer 104 to promote electrical contact between the substrate 102 and the absorber layer that is to be formed on it. For example, where the substrate 102 is made of aluminum the contact layer 104 may be a layer of molybdenum. For the purposes of the present discussion, the contact layer 104 may be regarded as being part of the substrate. As such, any discussion of forming or disposing a material or layer of material on the substrate 102 includes disposing or forming such material or layer on the contact layer 104, if one is used.

Figure 1B:
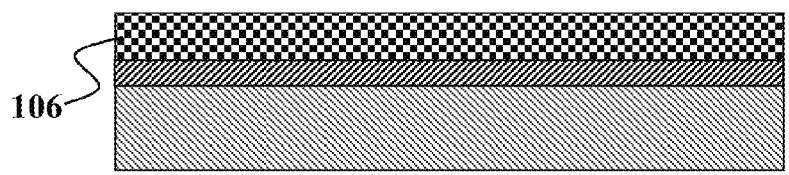

As shown in FIG. 1B, a precursor layer 106 is formed on the substrate. The precursor layer 106 contains one or more group IB elements and two or more different group IIIA elements. Preferably, the one or more group IB elements include copper, and the group IIIA elements include indium and gallium. By way of example, the precursor layer 106 may be a oxygen-free compound containing copper, indium and gallium. Preferably, the precursor layer is a compound of the form $Cu_zIn_xGa_{1-x}$, where $0 \le x \le 1$ and $0.5 \le z \le 1.5$. Those of skill in the art will recognize that other group IB elements may be substituted for Cu and other group IIIA elements may be substituted for In and Ga. As one nonlimiting example, the precursor layer is between about 10 nm and about 5000 nm thick. In other embodiments, the precursor layer may be between about 2.0 to about 0.4 microns thick.

Figure 1C:
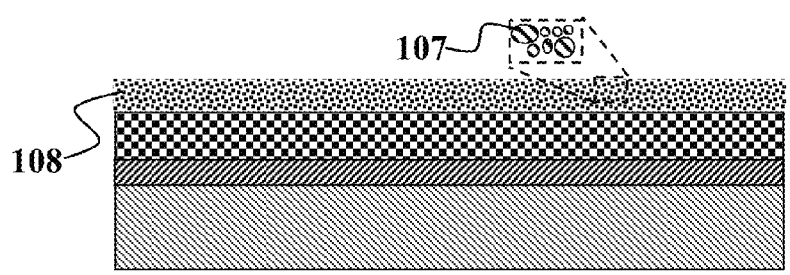
Figure 1D:
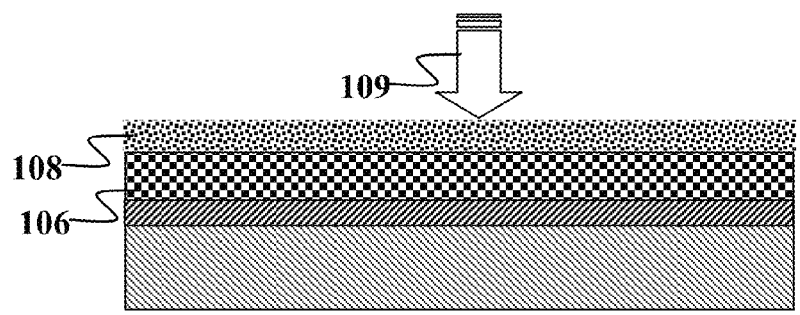
Figure 1E:

As shown in FIG. 1C, a layer 108 containing elemental chalcogen particles 107 over the precursor layer 106. By way of example, and without loss of generality, the chalcogen particles may be particles of selenium, sulfur or tellurium. As shown in FIG. 1D, heat 109 is applied to the precursor layer 106 and the layer 108 containing the chalcogen particles to heat them to a temperature sufficient to melt the chalcogen particles 107 and to react the chalcogen particles 107 with the group IB element and group IIIA elements in the precursor layer 106. The reaction of the chalcogen particles 107 with the group IB and IIIA elements forms a compound film 110 of a group IB-IIIA-chalcogenide compound as shown in FIG. 1E. Preferably, the group IB-IIIA-chalcogenide compound is of the form $Cu_zIn_{1-x}Ga_xSe_{2(1-y)}S_y$, where $0 \le x \le 1$, $0 \le y \le 1$, and $0.5 \le z \le 1.5$.

If the chalcogen particles 107 melt at a relatively low temperature (e.g., 220° C. for Se, 120° C. for S) the chalcogen is already in a liquid state and makes good contact with the group IB and IIIA nanoparticles in the precursor layer 106. If the precursor layer 106 and molten chalcogen are then heated sufficiently (e.g., at about 375° C.) the chalcogen reacts with the group IB and IIIA elements in the precursor layer 106 to form the desired IB-IIIA-chalcogenide material in the compound film 110. As one nonlimiting example, the precursor layer is between about 10 nm and about 5000 nm thick. In other embodiments, the precursor layer may be between about 4.0 to about 0.5 microns thick.

There are a number of different techniques for forming the IB-IIIA precursor layer 106. For example, the precursor layer 106 may be formed from a nanoparticulate film including nanoparticles containing the desired group IB and IIIA elements. The nanoparticles may be a mixture elemental nanoparticles, i.e., nanoparticles having only a single atomic species. Alternatively, the nanoparticles may be binary nanoparticles, e.g., Cu—In, In—Ga, or Cu—Ga or ternary particles, such as, but not limited to, Cu—In—Ga, or quaternary particles. Such nanoparticles may be obtained, e.g., by ball milling a commercially available powder of the desired elemental, binary or ternary material. These nanoparticles may be between about 0.1 nanometer and about 500 nanometers in size.

One of the advantages of the use of nanoparticle-based dispersions is that it is possible to vary the concentration of the elements within the compound film 110 either by building the precursor layer in a sequence of sub-layers or by directly varying the relative concentrations in the precursor layer 106. The relative elemental concentration of the nanoparticles that make up the ink for each sub-layer may be varied. Thus, for example, the concentration of gallium within the absorber layer may be varied as a function of depth within the absorber layer.

The layer 108 containing the chalcogen particles 107 may be disposed over the nanoparticulate film and the nanoparticulate film (or one or more of its constituent sub-layers) may be subsequently annealed in conjunction with heating the chalcogen particles 107. Alternatively, the nanoparticulate film may be annealed to form the precursor layer 106 before disposing the layer 108 containing elemental chalcogen particles 107 over precursor layer 106.

In one embodiment of the present invention, the nanoparticles in the nanoparticulate film used to form the precursor layer 106 contain no oxygen or substantially no oxygen other than those unavoidably present as impurities. The nanoparticulate film may be a layer of a dispersion, such as, but not limited to, an ink, paste, coating, or paint. The dispersion may include nanoparticles including group IB and IIIA elements in a solvent or other components. Chalcogens may be incidentally present in components of the nanoparticulate film other than the nanoparticles themselves. A film of the dispersion can be spread onto the substrate and annealed to form the precursor layer 106. By way of example the dispersion can be made by forming oxygen-free nanoparticles containing elements from group IB, group IIIA and intermixing these nanoparticles and adding them to a liquid. It should be understood that in some embodiments, the creation process for the particles and/or dispersion may include milling feedstock particles whereby the particles are already dispersed in a carrier liquid and/or dispersing agent. The precursor layer 106 may be formed using a variety of non-vacuum techniques such as but not limited to wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink jet printing, jet deposition, spray deposition, and the like, as well as combinations of the above and/or related technologies. In one embodiment of the present invention, the precursor layer 106 may be built up in a sequence of sub-layers formed one on top of another in a sequence. The nanoparticulate film may be heated to drive off components of the dispersion that are not meant to be part of the film and to anneal the particles and to form the compound film. By way of example, nanoparticulate-based inks containing elements and/or solid solutions from groups IB and IIIA may be formed as described in commonly-assigned US Patent Application publication 20050183767, which has been incorporated herein by reference.

The nanoparticles making up the dispersion may be in a desired particle size range of between about 0.1 nm and about 500 nm in diameter, preferably between about 10 nm and about 300 nm in diameter, and more preferably between about 50 nm and 250 nm. In still other embodiments, the particles may be between about 200 nm and about 500 nm.

In some embodiments, one or more group IIIA elements may be provided in molten form. For example, an ink may be made starting with a molten mixture of Gallium and/or Indium. Copper nanoparticles may then be added to the mixture, which may then be used as the ink/paste. Copper nanoparticles are also commercially available. Alternatively, the temperature of the Cu—Ga—In mixture may be adjusted (e.g. cooled) until a solid forms. The solid may be ground at that temperature until small nanoparticles (e.g., less than about 100 nm) are present.

In other embodiments of the invention, the precursor layer 106 may be fabricated by forming a molten mixture of one or more metals of group IIIA and metallic nanoparticles containing elements of group IB and coating the substrate with a film formed from the molten mixture. The molten mixture may include a molten group IIIA element containing nanoparticles of a group IB element and (optionally) another group IIIA element. By way of example nanoparticles containing copper and gallium may be mixed with molten indium to form the molten mixture. The molten mixture may also be made starting with a molten mixture of Indium and/or Gallium. Copper nanoparticles may then be added to the molten mixture. Copper nanoparticles are also commercially available. Alternatively, such nanoparticles can be produced using any of a variety of well-developed techniques, including but not limited to (i) electro-explosion of copper wire, (ii) mechanical grinding of copper particles for a sufficient time so as to produce nanoparticles, or (iii) solution-based synthesis of copper nanoparticles from organometallic precursors or reduction of copper salts. Alternatively, the temperature of a molten Cu—Ga—In mixture may be adjusted (e.g. cooled) until a solid forms. In one embodiment of the present invention, the solid may be ground at that temperature until particles of a target size are present. Additional details of this technique are described in commonly assigned US Patent Application publication 2005183768, which is incorporated herein by reference. Optionally, the selenium particles prior to melting may be less than 1 micron, less than 500 nm, less than 400 nm, less than 300 nm, less than 200 nm, and/or less than 100 nm.

In another embodiment, the IB-IIIA precursor layer 106 may be formed using a composition of matter in the form of a dispersion containing a mixture of elemental nanoparticles of the IB, the IIIA, dispersed with a suspension of nanoglobules of Gallium. Based on the relative ratios of input elements, the gallium nanoglobule-containing dispersion can then have a Cu/(In +Ga) compositional ratio ranging from 0.01 to 1.0 and a Ga/(In +Ga) compositional ratio ranging from 0.01 to 1.0. This technique is described in commonly-assigned U.S. patent application Ser. No. 11/081,163, which has been incorporated herein by reference.

Alternatively, the precursor layer 106 may be fabricated using coated nanoparticles as described in commonly-assigned U.S. patent application Ser. No. 10/943,657, which is incorporated herein by reference. Various coatings could be deposited, either singly, in multiple layers, or in alternating layers, all of various thicknesses. Specifically, core nanoparticles containing one or more elements from group IB and/or 111A and/or VIA may be coated with one or more layers containing elements of group IB, IIIA or VIA to form coated nanoparticles. Preferably at least one of the layers contains an element that is different from one or more of the group IB, IIIA or VIA elements in the core nanoparticle. The group IB, IIIA and VIA elements in the core nanoparticle and layers may be in the form of pure elemental metals or alloys of two or more metals. By way of example, and without limitation, the core nanoparticles may include elemental copper, or alloys of copper with gallium, indium, or aluminum and the layers may be gallium, indium or aluminum. Using nanoparticles with a defined surface area, a layer thickness could be tuned to give the proper stoichiometric ratio within the aggregate volume of the nanoparticle. By appropriate coating of the core nanoparticles, the resulting coated nanoparticles can have the desired elements intermixed within the size scale of the nanoparticle, while the stoichiometry (and thus the phase) of the coated nanoparticle may be tuned by controlling the thickness of the coating(s).

In certain embodiments the precursor layer 106 (or selected constituent sub-layers, if any) may be formed by depositing a source material on the substrate to form a precursor, and heating the precursor to form a film. The source material may include Group IB-IIIA containing particles having at least one Group IB-IIIA phase, with Group IB-IIIA constituents present at greater than about 50 molar percent of the Group IB elements and greater than about 50 molar percent of the Group IIIA elements in the source material. Additional details of this technique are described in U.S. Pat. No. 5,985,691 to Basol, which is incorporated herein by reference.

Alternatively, the precursor layer 106 (or selected constituent sub-layers, if any) may be made from a precursor film containing one or more phase-stabilized precursors in the form of fine particles comprising at least one metal oxide. The oxides may be reduced in a reducing atmosphere. In particular single-phase mixed-metal oxide particles with an average diameter of less than about 1 micron may be used for the precursor. Such particles can be fabricated by preparing a solution comprising Cu and In and/or Ga as metal-containing compounds; forming droplets of the solution; and heating the droplets in an oxidizing atmosphere. The heating pyrolyzes the contents of the droplets thereby forming single-phase copper indium oxide, copper gallium oxide or copper indium gallium oxide particles. These particles can then be mixed with solvents or other additives to form a precursor material which can be deposited on the substrate, e.g., by screen printing, slurry spraying or the like, and then annealed to form the sub-layer. Additional details of this technique are described in U.S. Pat. No. 6,821,559 to Eberspacher, which is incorporated herein by reference.

Alternatively, the precursor layer 106 (or selected constituent sub-layers, if any) may be deposited using a precursor in the form of a nano-powder material formulated with a controlled overall composition and having particles of one solid solution. The nano-powder material precursor may be deposited to form the first, second layer or subsequent sub-layers, and reacted in at least one suitable atmosphere to form the corresponding component of the active layer. The precursor may be formulated from a nano-powder, i.e. a powdered material with nano-meter size particles. Compositions of the particles constituting the nano-powder used in precursor formulation are important for the repeatability of the process and the quality of the resulting compound films. The particles making up the nano-powder are preferably near-spherical in shape and their diameters are less than about 200 nm, and preferably less than about 100 nm. Alternatively, the nano-powder may contain particles in the form of small platelets. The nano-powder preferably contains copper-gallium solid solution particles, and at least one of indium particles, indium-gallium solid-solution particles, copper-indium solid solution particles, and copper particles. Alternatively, the nano-powder may contain copper particles and indium-gallium solid-solution particles.

Any of the various nanoparticulate compositions described above may be mixed with well known solvents, carriers, dispersants etc. to prepare an ink or a paste that is suitable for deposition onto the substrate 102. Alternatively, nano-powder particles may be prepared for deposition on a substrate through dry processes such as, but not limited to, dry powder spraying, electrostatic spraying or processes which are used in copying machines and which involve rendering charge onto particles which are then deposited onto substrates. After precursor formulation, the precursor, and thus the nano-powder constituents may be deposited onto the substrate 102 in the form of a micro-layer, e.g., using dry or wet processes. Dry processes include electrostatic powder deposition approaches where the prepared powder particles may be coated with poorly conducting or insulating materials that can hold charge. Examples of wet processes include screen printing, ink jet printing, ink deposition by doctor-blading, reverse roll coating etc. In these approaches the nano-powder may be mixed with a carrier which may typically be a water-based or organic solvent, e.g., water, alcohols, ethylene glycol, etc. The carrier and other agents in the precursor formulation may be totally or substantially evaporated away to form the micro-layer on the substrate. The micro-layer can subsequently be reacted to form the sub-layer. The reaction may involve an annealing process, such as, but not limited to, furnace-annealing, RTP or laser-annealing, microwave annealing, among others. Annealing temperatures may be between about 350° C. to about 600° C. and preferably between about 400° C. to about 550° C. The annealing atmosphere may be inert, e.g., nitrogen or argon. Alternatively, the reaction step may employ an atmosphere with a vapor containing at least one Group VIA element (e.g., Se, S, or Te) to provide a desired level of Group VIA elements in the absorber layer. Further details of this technique are described in US Patent Application Publication 20040219730 to Bulent Basol, which is incorporated herein by reference.

In certain embodiments of the invention, the precursor layer 106 (or any of its sub-layers) may be annealed, either sequentially or simultaneously. Such annealing may be accomplished by rapid heating of the substrate 102 and precursor layer 106 from an ambient temperature to a plateau temperature range of between about 200° C. and about 600° C. The temperature is maintained in the plateau range for a period of time ranging between about a fraction of a second to about 60 minutes, and subsequently reduced. Alternatively, the annealing temperature could be modulated to oscillate within a temperature range without being maintained at a particular plateau temperature. This technique (referred to herein as rapid thermal annealing or RTA) is particularly suitable for forming photovoltaic active layers (sometimes called "absorber" layers) on metal foil substrates, such as, but not limited to, aluminum foil. Additional details of this technique are described in U.S. patent application Ser. No. 10/943,685, which is incorporated herein by reference.

Other alternative embodiments of the invention utilize techniques other than printing processes to form the absorber layer. For example, a group IB and/or group MA elements may be deposited onto the top surface of a substrate and/or onto the top surface of one or more of the sub-layers of the active layer by atomic layer deposition (ALD). For example a thin layer of Ga may be deposited by ALD at the top of a stack of sub-layers formed by printing techniques. By use of ALD, copper, indium, and gallium, may be deposited in a precise stoichiometric ratio that is intermixed at or near the atomic level. Furthermore, by changing sequence of exposure pulses for each precursor material, the relative composition of Cu, In, Ga and Se or S within each atomic layer can be systematically varied as a function of deposition cycle and thus depth within the absorber layer. Such techniques are described in US Patent Application Publication 20050186342, which is incorporated herein by reference. Alternatively, the top surface of a substrate could be coated by using any of a variety of vacuum-based deposition techniques, including but not limited to sputtering, evaporation, chemical vapor deposition, physical vapor deposition, electron-beam evaporation, and the like.

The chalcogen particles 107 in the layer 108 may be between about 1 nanometer and about 50 microns in size, preferably between about 100 nm and 10 microns, more preferably between about 100 nm and 1 micron, and most preferably between about 150 and 300 nm. It is noted that the chalcogen particles 107 may be larger than the final thickness of the IB-IIIA-VIA compound film 110. The chalcogen particles 107 may be mixed with solvents, carriers, dispersants etc. to prepare an ink or a paste that is suitable for wet deposition over the precursor layer 106 to form the layer 108. Alternatively, the chalcogen particles 107 may be prepared for deposition on a substrate through dry processes to form the layer 108. It is also noted that the heating of the layer 108 containing chalcogen particles 107 may be carried out by an RTA process, e.g., as described above.

The chalcogen particles 107 (e.g., Se or S) may be formed in several different ways. For example, Se or S particles may be formed starting with a commercially available fine mesh powder (e.g., 200 mesh/75 micron) and ball milling the powder to a desirable size. A typical ball milling procedure may use a ceramic milling jar filled with grinding ceramic balls and a feedstock material, which may be in the form of a powder, in a liquid medium. When the jar is rotated or shaken, the balls shake and grind the powder in the liquid medium to reduce the size of the particles of the feedstock material. Optionally, ball mills with specially designed agitator may be used to move the beads into the material to be processed.

Examples of chalcogen powders and other feedstocks commercially available are listed in Table I below.

TABLE I

| Chemical | Formula | Typical % Purity |
|---|---|---|
| Selenium metal | Se | 99.99 |
| Selenium metal | Se | 99.6 |
| Selenium metal | Se | 99.6 |
| Selenium metal | Se | 99.999 |
| Selenium metal | Se | 99.999 |
| Sulfur | S | 99.999 |
| Tellurium metal | Te | 99.95 |
| Tellurium metal | Te | 99.5 |
| Tellurium metal | Te | 99.5 |
| Tellurium metal | Te | 99.9999 |
| Tellurium metal | Te | 99.99 |
| Tellurium metal | Te | 99.999 |
| Tellurium metal | Te | 99.999 |

TABLE I-continued

| Chemical | Formula | Typical % Purity |
|---|---|---|
| Tellurium metal | Te | 99.95 |
| Tellurium metal | Te | 99.5 |

Se or S particles may alternatively be formed using an evaporation-condensation method. Alternatively, Se or S feedstock may be melted and sprayed ("atomization") to form droplets that solidify into nanoparticles.

The chalcogen particles 107 may also be formed using a solution-based technique, which also is called a "Top-Down" method (Nano Letters, 2004 Vol. 4, No. 10 2047-2050 "Bottom-Up and Top-Down Approaches to Synthesis of Monodispersed Spherical Colloids of low Melting-Point Metals"- Yuliang Wang and Younan Xia). This technique allows processing of elements with melting points below 400° C. as monodispersed spherical colloids, with diameter controllable from 100 nm to 600 nm, and in copious quantities. For this technique, chalcogen (Se or S) powder is directly added to boiling organic solvent, such as di(ethylene glycol) and melted to produce droplets. After the reaction mixture had been vigorously stirred and thus emulsified for 20 min, uniform spherical colloids of metal obtained as the hot mixture is poured into a cold organic solvent bath (e.g. ethanol) to solidify the chalcogen (Se or Se) droplets.

Figure 1F:
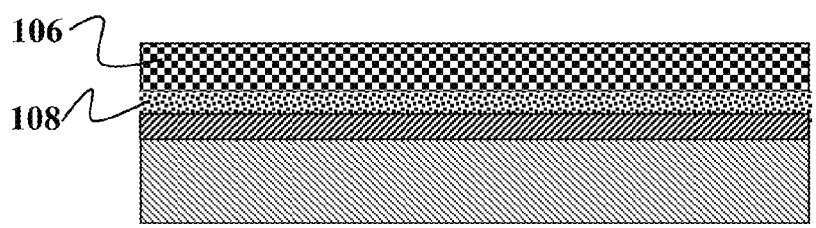
FIG. 1F shows yet another embodiment of the present invention.

Referring now to FIG. 1F, it should also be understood that in some embodiments of the present invention, the layer 108 of chalcogen particles may be formed below the precursor layer 106. This position of the layer 108 still allows the chalcogen particles to provide a sufficient surplus of chalcogen to the precursor layer 106 to fully react with the group IB and group IIIA elements in layer 106. Additionally, since the chalcogen released from the layer 108 may be rising through the layer 106, this position of the layer 108 below layer 106 may be beneficial to generate greater intermixing between elements. The thickness of the layer 108 may be in the range of about 10 nm to about 5 microns. In other embodiments, the thickness of the layer 108 may be in the range of about 4.0 microns to about 0.5 microns.

Figure 2A:
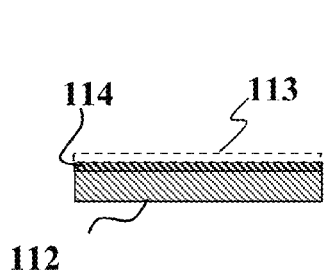
FIGS. 2A-2F are a sequence of schematic cross-sectional diagrams illustrating fabrication of a photovoltaic active layer according to an alternative embodiment of the present invention.

According to a second embodiment of the present invention, the compound layer may include one or more group IB elements and one or more group IIIA elements. Fabrication may proceed as illustrated in FIGS. 2A-2F. The absorber layer may be formed on a substrate 112, as shown in FIG. 2A. A surface of the substrate 112, may be coated with a contact layer 114 to promote electrical contact between the substrate 112 and the absorber layer that is to be formed on it. By way of example, an aluminum substrate 112 may be coated with a contact layer 114 of molybdenum. As discussed above, forming or disposing a material or layer of material on the substrate 112 includes disposing or forming such material or layer on the contact layer 114, if one is used. Optionally, it should also be understood that a layer 115 may also be formed on top of contact layer 114 and/or directly on substrate 112. This layer may be solution coated, evaporated, and/or deposited using vacuum based techniques. Although not limited to the following, the layer 115 may have a thickness less than that of the precursor layer 116. In one nonlimiting example, the layer may be between about 1 to about 100 nm in thickness. The layer 115 may be comprised of various materials including but not limited to at least one of the following: a group IB element, a group IIIA element, a group VIA element, a group IA element (new style: group 1), a binary and/or multi-nary alloy of any of the preceding elements, a solid solution of any of the preceding elements, copper, indium, gallium, selenium, copper indium, copper gallium, indium gallium, sodium, a sodium compound, sodium fluoride, sodium indium sulfide, copper selenide, copper sulfide, indium selenide, indium sulfide, gallium selenide, gallium sulfide, copper indium selenide, copper indium sulfide, copper gallium selenide, copper gallium sulfide, indium gallium selenide, indium gallium sulfide, copper indium gallium selenide, and/or copper indium gallium sulfide.

Figure 2B:
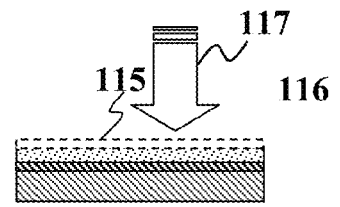

As shown in FIG. 2B, a precursor layer 116 is formed on the substrate. The precursor layer 116 contains one or more group IB elements and one or more group IIIA elements. Preferably, the one or more group IB elements include copper. The one or more group IIIA elements may include indium and/or gallium. The precursor layer may be formed from a nanoparticulate film, e.g., using any of the techniques described above. In some embodiments, the particles may be particles that are substantially oxygen-free, which may include those that include less than about 1 wt % of oxygen. Other embodiments may use materials with less than about 5 wt % of oxygen. Still other embodiments may use materials with less than about 3 wt % oxygen. Still other embodiments may use materials with less than about 2 wt % oxygen. Still other embodiments may use materials with less than about 0.5 wt % oxygen. Still other embodiments may use materials with less than about 0.1 wt % oxygen.

Optionally, as seen in FIG. 2B, it should also be understood that a layer 117 may also be formed on top of precursor layer 116. It should be understood that the stack may have both layers 115 and 117, only one of the layers, or none of the layers. Although not limited to the following, the layer 117 may have a thickness less than that of the precursor layer 116. In one nonlimiting example, the layer may be between about 1 to about 100 nm in thickness. The layer 117 may be comprised of various materials including but not limited to at least one of the following: a group IB element, a group IIIA element, a group VIA element, a group IA element (new style: group 1), a binary and/or multinary alloy of any of the preceding elements, a solid solution of any of the preceding elements, copper, indium, gallium, selenium, copper indium, copper gallium, indium gallium, sodium, a sodium compound, sodium fluoride, sodium indium sulfide, copper selenide, copper sulfide, indium selenide, indium sulfide, gallium selenide, gallium sulfide, copper indium selenide, copper indium sulfide, copper gallium selenide, copper gallium sulfide, indium gallium selenide, indium gallium sulfide, copper indium gallium selenide, and/or copper indium gallium sulfide.

Figure 2C:
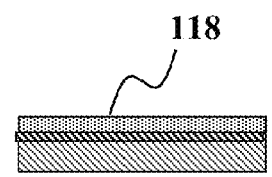

In one embodiment, the precursor layer 116 may be formed by other means, such as, but not limited to, evaporation, sputtering, ALD, etc. By way of example, the precursor layer 116 may be a oxygen-free compound containing copper, indium and gallium. Heat 117 is applied to anneal the precursor layer 116 into a group IB-IIIA compound film 118 as shown in FIGS. 2B-2C. The heat 117 may be supplied in a rapid thermal annealing process, e.g., as described above. Specifically, the substrate 112 and precursor layer 116 may be heated from an ambient temperature to a plateau temperature range of between about 200° C. and about 600° C. The temperature is maintained in the plateau range for a period of time ranging between about a fraction of a second to about 60 minutes, and subsequently reduced.

Figure 2D:
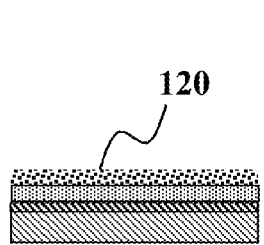

As shown in FIG. 2D, a layer 120 containing elemental chalcogen particles over the precursor layer 116. By way of example, and without loss of generality, the chalcogen particles may be particles of selenium, sulfur or tellurium. Such particles may be fabricated as described above. The chalcogen particles in the layer 120 may be between about 1 nanometer and about 25 microns in size. The chalcogen particles may be mixed with solvents, carriers, dispersants etc. to prepare an ink or a paste that is suitable for wet deposition over the precursor layer 116 to form the layer 120. Alternatively, the chalcogen particles may be prepared for deposition on a substrate through dry processes to form the layer 120.

Figure 2E:
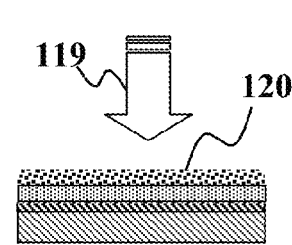
Figure 2F:
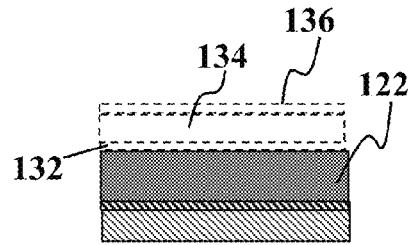

As shown in FIG. 2E, heat 119 is applied to the precursor layer 116 and the layer 120 containing the chalcogen particles to heat them to a temperature sufficient to melt the chalcogen particles and to react the chalcogen particles with the group IB element and group IIIA elements in the precursor layer 116. The heat 119 may be applied in a rapid thermal annealing process, e.g., as described above. The reaction of the chalcogen particles with the group IB and IIIA elements forms a compound film 122 of a group IB-IIIA-chalcogenide compound as shown in FIG. 2F. The group IB-IIIA-chalcogenide compound is of the form $Cu_zIn_{1-x}Ga_xSe_{2(1-y)}S_y$, where $0 \leq x \leq 1$, $0 \leq y \leq 1$, $0.5 \leq z \leq 1.5$.

Referring still to FIGS. 2A-2F, it should be understood that sodium may also be used with the precursor material to improve the qualities of the resulting film. In a first method, as discussed in regards to FIGS. 2A and 2B, one or more layers of a sodium containing material may be formed above and/or below the precursor layer 116. The formation may occur by solution coating and/or other techniques such as but not limited to sputtering, evaporation, CBD, electroplating, sol-gel based coating, spray coating, chemical vapor deposition (CVD), physical vapor deposition (PVD), atomic layer deposition (ALD), and the like.

Optionally, in a second method, sodium may also be introduced into the stack by sodium doping the particles in the precursor layer 116. As a nonlimiting example, the chalcogenide particles and/or other particles in the precursor layer 116 may be a sodium containing material such as, but not limited to, Cu—Na, In—Na, Ga—Na, Cu—In—Na, Cu—Ga—Na, In—Ga—Na, Na—Se, Cu—Se—Na, In—Se—Na, Ga—Se—Na, Cu—In—Se—Na, Cu—Ga—Se—Na, In—Ga—Se—Na, Cu—In—Ga—Se—Na, Na—S, Cu—S—Na, In—S—Na, Ga—S—Na, Cu—In—S—Na, Cu—Ga—S—Na, In—Ga—S—Na, and/or Cu—In—Ga—S—Na. In one embodiment of the present invention, the amount of sodium in the chalcogenide particles and/or other particles may be about 1 at. % or less. In another embodiment, the amount of sodium may be about 0.5 at. % or less. In yet another embodiment, the amount of sodium may be about 0.1 at. % or less. It should be understood that the doped particles and/or flakes may be made by a variety of methods including milling feedstock material with the sodium containing material and/or elemental sodium.

Optionally, in a third method, sodium may be incorporated into the ink itself, regardless of the type of particle, nanoparticle, microflake, and/or nanoflakes dispersed in the ink. As a nonlimiting example, the ink may include particles (Na doped or undoped) and a sodium compound with an organic counter-ion (such as but not limited to sodium acetate) and/or a sodium compound with an inorganic counter-ion (such as but not limited to sodium sulfide). It should be understood that sodium compounds added into the ink (as a separate compound), might be present as particles (e.g. nanoparticles), or dissolved. The sodium may be in "aggregate" form of the sodium compound (e.g. dispersed particles), and the "molecularly dissolved" form.

None of the three aforementioned methods are mutually exclusive and may be applied singly or in any single or multiple combination to provide the desired amount of sodium to the stack containing the precursor material. Additionally, sodium and/or a sodium containing compound may also be added to the substrate (e.g. into the molybdenum target). Also, sodium-containing layers may be formed in between one or more precursor layers if multiple precursor layers (using the same or different materials) are used. It should also be understood that the source of the sodium is not limited to those materials previously listed. As a nonlimiting example, basically, any deprotonated alcohol where the proton is replaced by sodium, any deprotonated organic and inorganic acid, the sodium salt of the (deprotonated) acid, sodium hydroxide, sodium acetate, and the sodium salts of the following acids: butanoic acid, hexanoic acid, octanoic acid, decanoic acid, dodecanoic acid, tetradecanoic acid, hexadecanoic acid, 9-hexadecenoic acid, octadecanoic acid, 9-octadecenoic acid, 11-octadecenoic acid, 9,12-octadecadienoic acid, 9,12,15-octadecatrienoic acid, and/or 6,9,12-octadecatrienoic acid.

Optionally, as seen in FIG. 2F, it should also be understood that sodium and/or a sodium compound may be added to the processed chalcogenide film after the precursor layer has been annealed or otherwise processed. This embodiment of the present invention thus modifies the film after CIGS formation. With sodium, carrier trap levels associated with the grain boundaries are reduced, permitting improved electronic properties in the film. A variety of sodium containing materials such as those listed above may be deposited as layer 132 onto the processed film and then annealed to treat the CIGS film.

Additionally, the sodium material may be combined with other elements that can provide a bandgap widening effect. Two elements which would achieve this include gallium and sulfur. The use of one or more of these elements, in addition to sodium, may further improve the quality of the absorber layer. The use of a sodium compound such as but not limited to $Na_2S$, $NaInS_2$, or the like provides both Na and S to the film and could be driven in with an anneal such as but not limited to an RTA step to provide a layer with a bandgap different from the bandgap of the unmodified CIGS layer or film.

Figure 2G:
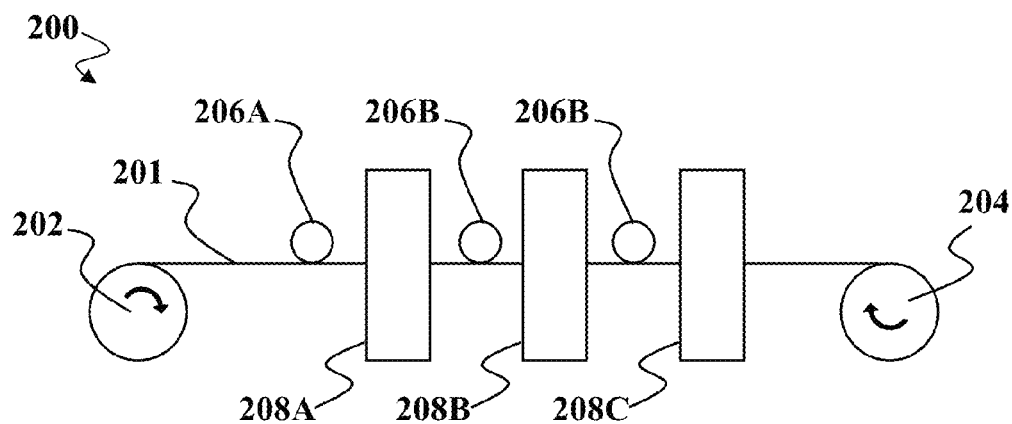
FIG. 2G is a schematic diagram of a roll-to-roll processing apparatus that may be used with embodiments of the present invention.

Referring now to FIG. 2G, it should be understood that embodiments of the invention are also compatible with roll-to-roll manufacturing. Specifically, in a roll-to-roll manufacturing system 200 a flexible substrate 201, e.g., aluminum foil travels from a supply roll 202 to a take-up roll 204. In between the supply and take-up rolls, the substrate 201 passes a number of applicators 206A, 206B, 206C, e.g. microgravure rollers and heater units 208A, 208B, 208C. Each applicator deposits a different layer or sub-layer of a photovoltaic device active layer, e.g., as described above. The heater units are used to anneal the different sub-layers. In the example depicted in FIG. 2G, applicators 206A and 206B may apply different sub-layers of a precursor layer (such as precursor layer 106 or precursor layer 116). Heater units 208A and 208B may anneal each sub-layer before the next sub-layer is deposited. Alternatively, both sub-layers may be annealed at the same time. Applicator 206C may apply a layer of material containing chalcogen particles as described above. Heater unit 208C heats the chalcogen layer and precursor layer as described above. Note that it is also possible to deposit the precursor layer (or sub-layers) then deposit the chalcogen-containing layer and then heat all three layers together to form the IB-IIIA-chalcogenide compound film used for the photovoltaic absorber layer.

The total number of printing steps can be modified to construct absorber layers with bandgaps of differential gradation. For example, additional films (fourth, fifth, sixth, and so forth) can be printed (and optionally annealed between printing steps) to create an even more finely-graded bandgap within the absorber layer. Alternatively, fewer films (e.g. double printing) can also be printed to create a less finely-graded bandgap.

Alternatively multiple layers can be printed and reacted with chalcogen before deposition of the next layer, as seen in FIG. 2F. One nonlimiting example would be to deposit a Cu—In—Ga layer, anneal it, then deposit a Se layer then treat that with RTA, follow that up by depositing another precursor layer 134 rich in Ga followed by another deposition of an Se layer 136 finished by a second RTA treatment. The embodiment may or may not have the layer 132, in which case if it does not, layer 134 will rest directly on layer 122. More generically, one embodiment of the method comprises depositing a precursor layer, annealing it, depositing a non-oxygen chalcogen layer, treating the combination with RTA, forming at least a second precursor layer (possibly with precursor materials different from those in the first precursor layer) on the existing layers, depositing another non-oxygen chalcogen layer, and treating the combination with RTA. This sequence may be repeated to build multiple sets of precursor layers or precursor layer/chalcogen layer combinations (depending on whether a heating step is used after each layer).

Figure 3:
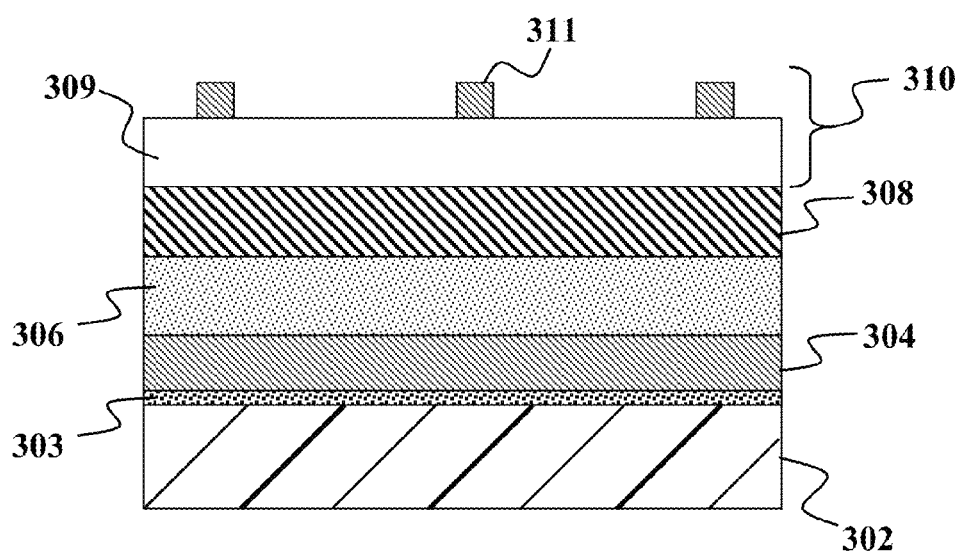
FIG. 3 is a cross-sectional schematic diagram of a photovoltaic device having an active layer fabricated according to an embodiment of the present invention.

The compound films 110, 122 fabricated as described above may serve as absorber layers in photovoltaic devices. An example of such a photovoltaic device 300 is shown in FIG. 3. The device 300 includes a base substrate 302, an optional adhesion layer 303, a base electrode 304, an absorber layer 306 incorporating a compound film of the type described above, a window layer 308 and a transparent electrode 310. By way of example, the base substrate 302 may be made of a metal foil, a polymer such as polyimides (PI), polyamides, polyetheretherketone (PEEK), Polyethersulfone (PES), polyetherimide (PEI), polyethylene naphtalate (PEN), Polyester (PET), related polymers, or a metallized plastic. The base electrode 304 is made of an electrically conducive material. By way of example, the base electrode 304 may be of a metal layer whose thickness may be selected from the range of about 0.1 micron to about 25 microns. An optional intermediate layer 303 may be incorporated between the electrode 304 and the substrate 302. The transparent electrode 310 may include a transparent conductive layer 309 and a layer of metal (e.g., Al, Ag or Ni) fingers 311 to reduce sheet resistance.

The window layer 308 serves as a junction partner between the compound film and the transparent conducting layer 309. By way of example, the window layer 308 (sometimes referred to as a junction partner layer) may include inorganic materials such as cadmium sulfide (CdS), zinc sulfide (ZnS), zinc hydroxide, zinc selenide (ZnSe), n-type organic materials, or some combination of two or more of these or similar materials, or organic materials such as n-type polymers and/or small molecules. Layers of these materials may be deposited, e.g., by chemical bath deposition (CBD) or chemical surface deposition, to a thickness ranging from about 2 nm to about 1000 nm, more preferably from about 5 nm to about 500 nm, and most preferably from about 10 nm to about 300 nm.

The transparent conductive layer 309 may be inorganic, e.g., a transparent conductive oxide (TCO) such as indium tin oxide (ITO), fluorinated indium tin oxide, zinc oxide (ZnO) or aluminum doped zinc oxide, or a related material, which can be deposited using any of a variety of means including but not limited to sputtering, evaporation, CBD, electroplating, sol-gel based coating, spray coating, chemical vapor deposition (CVD), physical vapor deposition (PVD), atomic layer deposition (ALD), and the like. Alternatively, the transparent conductive layer may include a transparent conductive polymeric layer, e.g. a transparent layer of doped PEDOT (Poly-3,4-Ethylenedioxythiophene), carbon nanotubes or related structures, or other transparent organic materials, either singly or in combination, which can be deposited using spin, dip, or spray coating, and the like. Combinations of inorganic and organic materials can also be used to form a hybrid transparent conductive layer. Examples of such a transparent conductive layer are described e.g., in commonly-assigned US Patent Application Publication Number 20040187917, which is incorporated herein by reference.

Those of skill in the art will be able to devise variations on the above embodiments that are within the scope of these teachings. For example, it is noted that in embodiments of the present invention, the IB-IIIA precursor layers (or certain sub-layers of the precursor layers) may be deposited using techniques other than nanoparticulate-based inks For example precursor layers or constituent sub-layers may be deposited using any of a variety of alternative deposition techniques including but not limited to vapor deposition techniques such as ALD, evaporation, sputtering, CVD, PVD, electroplating and the like.

By using a particulate chalcogen layer disposed over a IB-IIIA precursor film, slow and costly vacuum deposition steps (e.g., evaporation, sputtering) may be avoided. Embodiments of the present invention may thus leverage the economies of scale associated with printing techniques in general and roll-to-roll printing techniques in particular. Thus photovoltaic devices may be manufactured quickly, inexpensively and with high throughput.

Figure 4A:
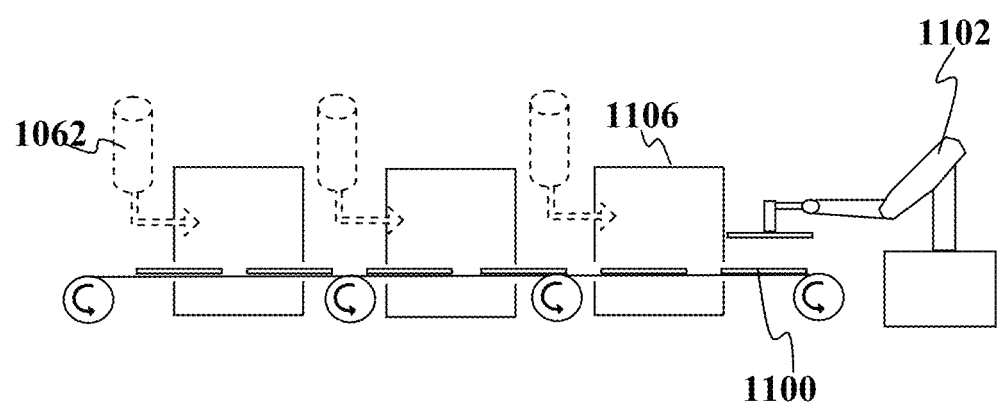
FIG. 4A shows one embodiment of a system for use with rigid substrates according to one embodiment of the present invention.

Referring now to FIG. 4A, it should also be understood that the embodiments of the present invention may also be used on a rigid substrate 1100. By way of nonlimiting example, the rigid substrate 1100 may be glass, soda-lime glass, steel, stainless steel, aluminum, polymer, ceramic, coated polymer, or other rigid material suitable for use as a solar cell or solar module substrate. A high speed pick-and-place robot 1102 may be used to move rigid substrates 1100 onto a processing area from a stack or other storage area. In FIG. 16A, the substrates 1100 are placed on a conveyor belt which then moves them through the various processing chambers. Optionally, the substrates 1100 may have already undergone some processing by the time and may already include a precursor layer on the substrate 1100. Other embodiments of the invention may form the precursor layer as the substrate 1100 passes through the chamber 1106.

Figure 4B:
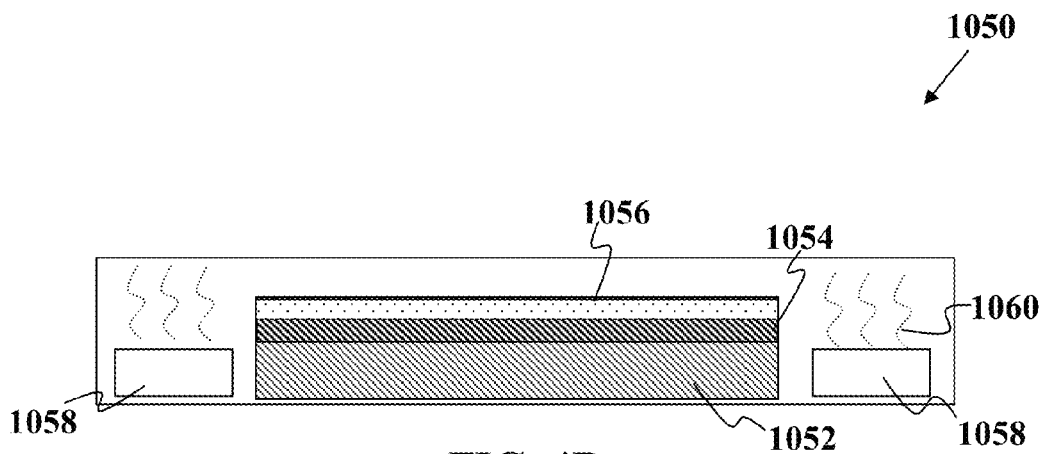
FIG. 4B shows one embodiment of a system for use with rigid substrates according to one embodiment of the present invention.

Referring now to FIG. 4B, it should be understood that any of the foregoing may also be used in a chalcogen vapor environment. In this embodiment for use with a microflake precursor material, it should be understood that overpressure from chalcogen vapor is used to provide a chalcogen atmosphere to improve processing of the film and crystal growth. FIG. 16A shows a chamber 1050 with a substrate 1052 having a contact layer 1054 and a precursor layer 1056. Extra sources 1058 of chalcogen are included in the chamber and are brought to a temperature to generate chalcogen vapor as indicated by lines 1060. In one embodiment of the present invention, the chalcogen vapor is provided to have a partial pressure of the chalcogen present in the atmosphere greater than or equal to the vapor pressure of chalcogen that would be required to maintain a partial chalcogen pressure at the processing temperature and processing pressure to minimize loss of chalcogen from the precursor layer, and if desired, provide the precursor layer with additional chalcogen. The partial pressure is determined in part on the temperature that the chamber 1050 or the precursor layer 1056 is at. It should also be understood that the chalcogen vapor is used in the chamber 1050 at a non-vacuum pressure. In one embodiment, the pressure in the chamber is at about atmospheric pressure. Per the ideal gas law PV=nRT, it should be understood that the temperature influences the vapor pressure. In one embodiment, this chalcogen vapor may be provided by using a partially or fully enclosed chamber with a chalcogen source 1062 therein or coupled to the chamber. In another embodiment using a more open chamber, the chalcogen atmosphere overpressure may be provided by supplying a source producing a chalcogen vapor. The chalcogen vapor may serve to help keep the chalcogen in the film or to provide the chalcogen to covert the precursor layer. Thus, the chalcogen vapor may or may not be used to provide excess chalcogen. In some embodiments, this may serve more to keep the chalcogen present in the film than to provide more chalcogen into the film.

Optionally, this vapor or atmosphere maybe used as a chalcogen that is introduced into an otherwise chalcogen free or selenium free precursor layer. It should be understood that the exposure to chalcogen vapor may occur in a non-vacuum environment. The exposure to chalcogen vapor may occur at or near atmospheric pressure. These conditions may be applicable to any of the embodiments described herein. The chalcogen may be carried into the chamber by a carrier gas. The carrier gas may be an inert gas such as nitrogen, argon, or the like. This chalcogen atmosphere system may be adapted for use in a roll-to-roll system.

Figure 4C:
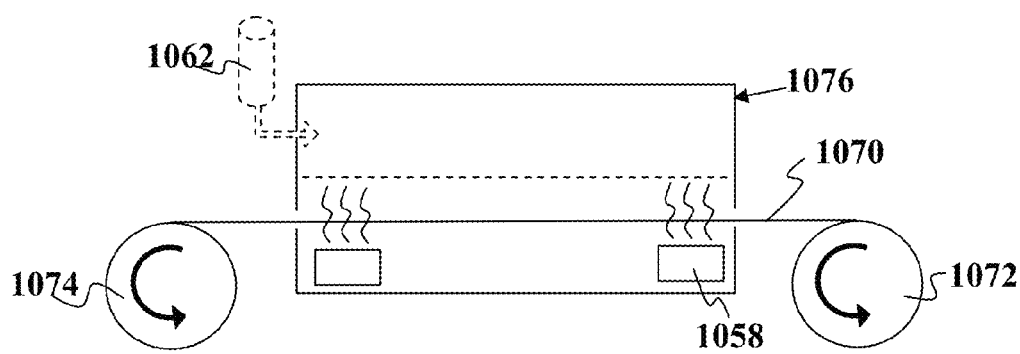
FIG. 4C shows a system according to another embodiment of the present invention.

Referring now to FIG. 4C, it shown that the present invention may be adopted for use with a roll-to-roll system where the substrate 1070 carrying the precursor layer may be flexible and configured as rolls 1072 and 1074. The chamber 1076 may be at vacuum or non-vacuum pressures. The chamber 1076 may be designed to incorporate a differential valve design to minimize the loss of chalcogen vapor at the chamber entry and chamber exit points of the roll-to-roll substrate 1070.

Figure 4D:
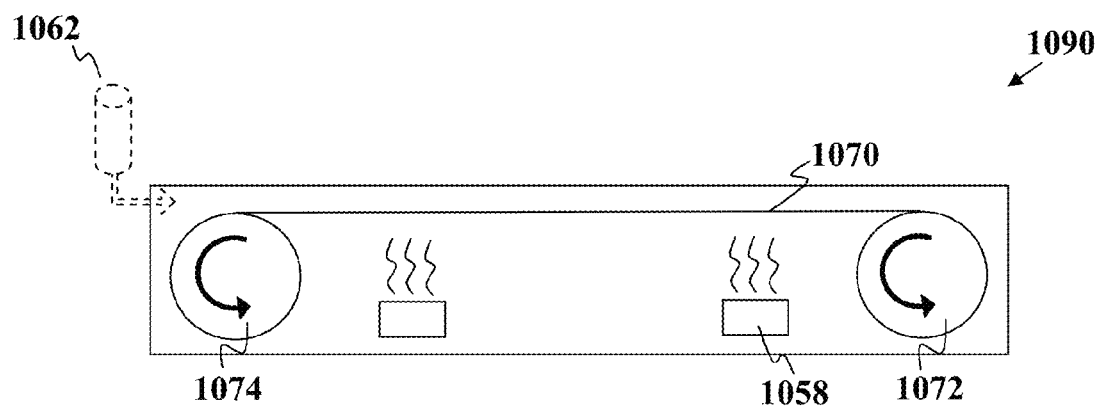
FIG. 4D shows a system according to yet another embodiment of the present invention.

Referring now to FIG. 4D, yet another embodiment of the present invention uses a chamber 1090 of sufficient size to hold the entire substrate, including any rolls 1072 or 1074 associated with using a roll-to-roll configuration.

Figure 5:
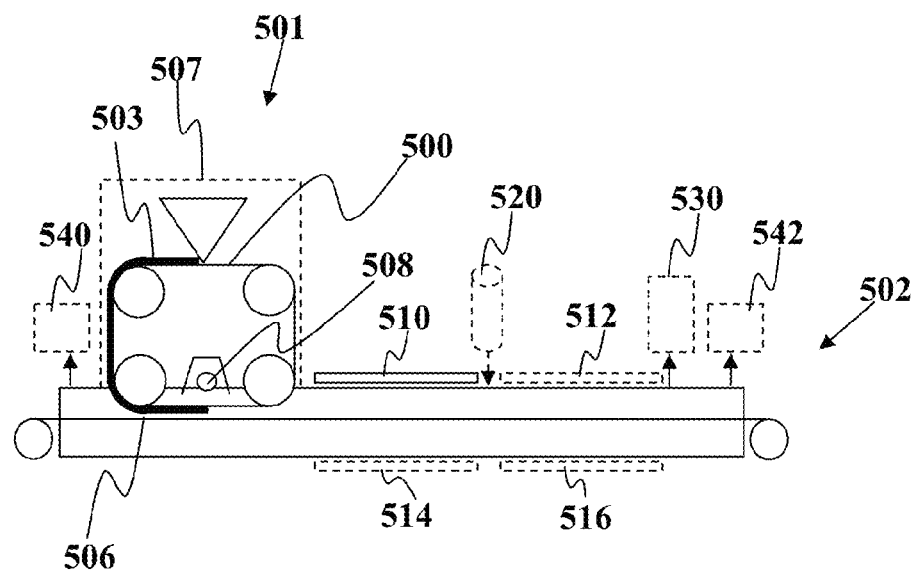
FIG. 5 shows a cross-sectional view of an inline roll-to-roll processing system according to one embodiment of the present invention.
Figure 6:
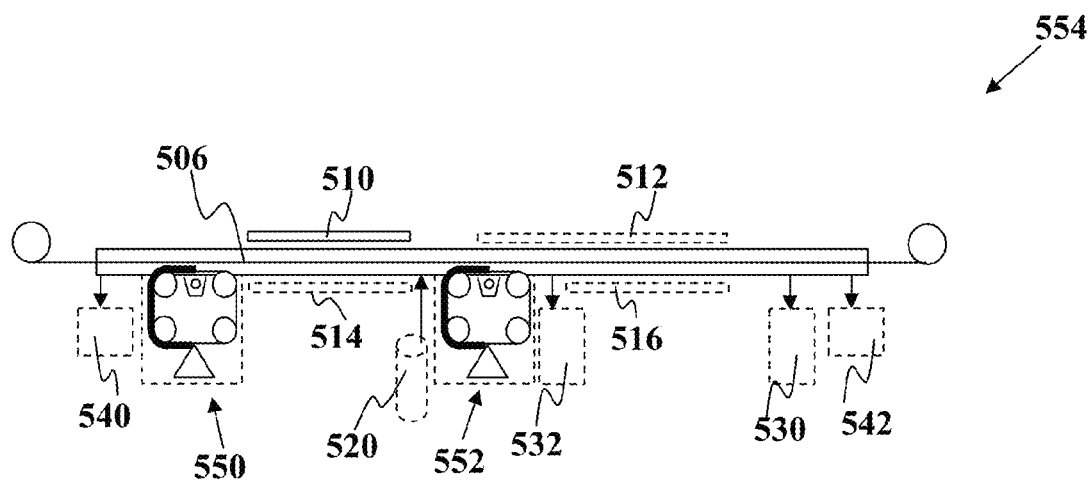
FIG. 6 shows a cross-sectional view of an inline roll-to-roll processing system with multiple deposition locations according to another embodiment of the present invention.

Referring now to FIGS. 5 to 6, yet another aspect of the present invention will now be described. This aspect provides methods and device wherein a group VIA material can be evaporated optionally at a close distance from a carrier web towards a web on which photovoltaic absorber precursor materials are deposited. In some embodiments, this precursor material may be a C—In—Ga material. The group VIA material being evaporated from the carrier web may form a group VIA-based vapor over the web with the precursor material. Optionally, at least some of the group VIA material may be condensed on top of the web with the precursor material. This condensation may provide a high throughput manner of introducing group VIA material into the photovoltaic absorber precursor material on the web. It should be understood that in some embodiments, in place of a web, the photovoltaic absorber precursor material may be on a rigid substrate. This rigid substrate may be carried on a conveyor, on carrier web, or other transport mechanism.

In one embodiment of the present invention, the selenization of C+I+G layers into CIGS or CIGSS films typically includes the addition and reaction of selenium (Se) at elevated temperatures. This Se can be supplied in vapor form (as Se, Et2Se or H2Se) and/or as a solid. The reaction kinetics of Se-vapor selenization are relatively slow requiring typically 30-60 minutes at high temperatures, i.e. >450° C., to achieve device-quality CIGS. Reactions of Cu—In—Ga materials with solid state Se are much faster at comparable temperatures, requiring only minutes to react. Optionally, a combination of both vapor and solid state Se may be used. Therefore for high throughput manufacturing a solid state RTP-like conversion/annealing process is desirable. Although selenium is used in this example, it should be understood that these techniques may also be applied to other group VIA material such as but not limited to sulfur.

Selenium can be deposited onto Cu—In—Ga by printing of powder or evaporation, typically in vacuum. Vacuum processes are generally more capital-intensive and cost more to operate due to the equipment limitations. Moreover they are often limited in throughput due to their nature. Therefore a non-vacuum approach to depositing Se is desirable for low-cost, high-throughput manufacturing. Printing of particles via inks/dispersions is one method to achieve this. Using milled selenium particles a uniform layer of Se can be printed onto Cu-rn-Ga containing films with sufficient uniformity and thickness control to provide the Se needed for the annealing process.

While printed Se adds simplicity to the tool set and improves throughput, it also has potential disadvantages. One disadvantage is that the Se should be size-reduced to micron or sub-micron size in order to uniformly coat a 3-6 micron thick layer. Additionally, dispersions typically require a surfactant or dispersant to improve the rheology and reduce agglomeration to allow for high quality printed layers. These surfactants and dispersants are typically organic compounds which, when heated, leave behind some carbon-bearing material. Additionally, whether the carbon is an issue for the growth of the CIGS during annealing, there are other constituents in the dispersant that may alter the growth kinetics of the CIGS film. Therefore printed Se particles would preferably be printed without dispersants, thereby eliminating both the advantages and disadvantages of these organic compounds.

Another potential disadvantage is the lack of contact of selenium to CIG layer at the atomic level. Because of the discrete nature of the particles, the contact to the underlying CIG films is quite poor, being contacted only at one point of each Se sphere. One might hope that the Se will melt early enough to uniformly wet the underlying CIG but because of selenium's dewetting nature this may or may not occur.

Chalcogenides

The above general background assumes Cu—In—Ga elemental or alloy precursor layers. The selenide precursor films have sufficient Se for stoichiometric CIGS. However the loss of Se during annealing requires an excess of Se to be supplied. Some embodiment the present invention may utilize Se evaporated onto the precursor surface to supply the excess Se in solid form. Optionally, one alternative to the use of Se vapor alone to provide "an overpressure in the cavity" above the annealing film. To create this group VIA vapor, a layer of Se can be positioned on a surface directly adjacent or opposite the annealing film. Such a film can be on the lid of a closed annealing box or on a glass sample clamped to the lid of the annealing box. For foil samples that are clamped and subsequently suspend upside down during annealing, a glass sample with Se deposited on it can be set inside the lid facing upward toward the annealing film to provide the Se vapor needed. The layer of Se can be deposited by several methods including evaporation and printing. If printing Se directly onto precursor layers prior to annealing introduces non-uniformities or other undesirable trait, Se can be printed onto a substrate which can in turn be used as a vapor source to minimize outgasing of Se from the film surface.

Although the embodiment herein discusses the use of Se, it should be understood that this is non-limiting and that the use of S in place of Se is also envisioned by embodiments of the present invention. By way of nonlimiting example, in a fashion similar to the Se vapor embodiments, sulfur vapor can be provided in vapor form using a deposited film directly opposite the annealing/annealed film. In the case of foil substrates in a strap-down boat, a glass slide can be coated with sulfur and laid in the box facing upward as the foil is suspended. In other embodiments such as roll-to-roll configurations, the sulfur may be deposited as shown the examples herein.

Referring now to FIG. 5, both Se and/or S can be supplied in an inline roll to roll annealing system by printing Se or S onto a belt 500 of deposition system 501 that travels through the furnace opposite the annealing film to provide Se in the form of vapor and possibly other elements such as but not limited to Na. However, in the case that solid state Se is of interest on the precursor layer prior to annealing an alternative method is to utilize an atmospheric pressure deposition method, similar to a close-spaced vapor transport process. In this particular embodiment, the envisioned process involves the application of Se near atmospheric pressure and near room temperature onto a moving belt 500 that is relatively un-reactive to Se at high temperatures, such as but not limited to titanium. This belt 500 with a layer 503 of group VIA material could be transported near a web 506 with CIG deposited thereon and heated very rapidly, perhaps from the rear and/or from the front, to vaporize the Se in a rapid fashion. The heating may be by way of a heating source 508 such as but not limited to an infrared heater 508. In this particular embodiment, the proximity of the room temperature web with CIG layer to the Se vapor would preferentially condense the Se onto the surface of web 506 with the precursor thereon. If the heating of the belt 500 causes undesired heating of the CIG, the web on which the CIG layers are depositing can be cooled, for instance by rolling over a chilled drum. Optionally, an enclosure 507 may be positioned around the belt 500 to prevent contamination of the belt and/or loss of gas from the furnace.

Optionally, in other embodiments, the web 506 is heated as well. Some of the group VIA material from belt 500 may condense onto the web 506 while some of the group VIA material remains a vapor. This vapor may be maintained in close proximity to the web 506 by the belt 500 and/or by an upper surface of the furnace. In one embodiment, the distance between the belt 500 to the web 506 may be in the range of about 1 mm to about 20 mm. Optionally, the distance between the belt 500 to the web 506 may be in the range of about 1 mm to about 100 mm. In one embodiment, the distance between the belt 500 to the web 506 may be in the range of about 1 mm to about 10 mm. Optionally, the belt 500 may be continuously moving, stationary, and/or advanced in a step manner.

FIG. 5 also shows that the furnace may include a heat source 510 that is used to heat the walls of the furnace and in turn heat the web 506. Optionally other heaters 512, 514, and/or 516 may also be included. Optionally, some portions of the furnace may not have active heating over certain portions.

FIG. 5 also shows that at least one separate group VIA vapor source 520 that may be optionally coupled to the furnace. This may provide additional vapor of the same group VIA material provided by belt 500. The gas line 522 from the vapor source 520 may also be heated. In one embodiment, it may be heated to a temperature sufficient to prevent group VIA material from condensing the gas line. In one embodiment, it may be heated to a temperature above the condensation temperature for the group VIA materials for the conditions in the gas line. Optionally, a carrier gas may also be used with the group VIA vapor to assist in transport. The carrier gas may be but is not limited to an inert gas or the like. Optionally, the source 520 may provide a different group VIA material such as but not limited to sulfur. Optionally the source 520 may provide an entirely different material all together such as but not limited to an non-group VIA material.

FIG. 5 also shows that at least one condenser 530 may be used to condense any excess group VIA vapor that remains in the furnace 502. Again, the gas line(s) leading to the condenser 530 may optionally be heated to a temperature sufficient to prevent condensation of the group VIA or other vapor material in the gas line leading to the condenser 530. The condenser may itself be a single stage condenser, a dual stage condenser, or a multi-stage condenser. Some embodiments may use a condenser with multiple chambers and/or tortuous path therein. Optionally, an additional filter may be coupled downstream and/or upstream from the condenser to assist in removal of group VIA material. The filter may use ceramic fiber material or other corrosion resistant material to withstand the group VIA vapors used in the furnace. The condenser may be used to collect unprocessed material in the process gas and recycle this material for re-use or to send the material to a disposal facility.

The furnace 502 may be run under below atmospheric pressure, below atmospheric pressure or above atmospheric pressure. FIG. 5 shows that optionally, additional vents 540 and/or 542 may be used at or near the entrance and/or exits of the furnace to minimize gas loss into the open environment when the furnace 502 is being run at or near atmospheric pressure. These vents 540 and/or 542 may be used draw the gasses in the furnace away from the exits to prevent any undesired leakage. Some embodiments of the present invention may use one or more than one set of vents to provide multiple stages of venting at either opening.

Referring now to FIG. 6, yet another embodiment of the present invention may now be described. This embodiment shows that multiple deposition systems 550 and 552 maybe used with a furnace 554 with the web 506. The deposition system 550 may deposit one type of group VIA material while the deposition system 552 may be deposit a second type group VIA material. Optionally, deposition system 552 may deposit an entirely different material over the web 506. The dual deposition system of FIG. 6 allows for additional material to be introduced into the process if the deposition system 550 is unable to deposit a sufficient amount of material.

FIG. 6 also shows that the position of the web 506 is above deposition systems 550 and 552. This will allow the group VIA vapor from the deposition systems 550 and/or 552 to rise towards the web 506.

Figure 7A:
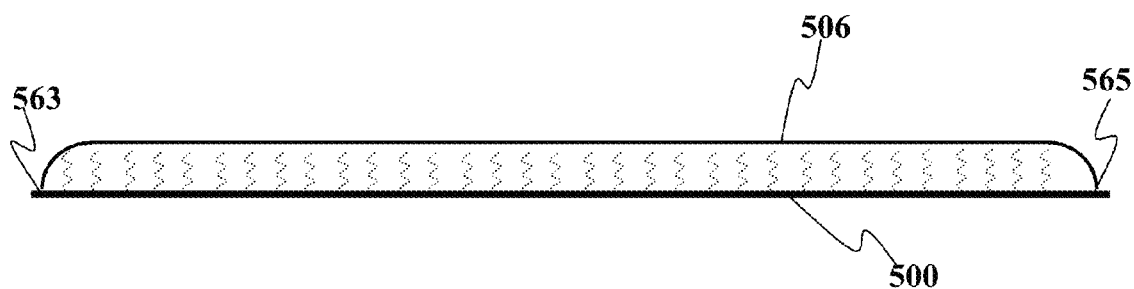
FIGS. 7A and 7B show down-web cross-sectional views of processing systems according to some embodiments of the present invention.
Figure 7B:
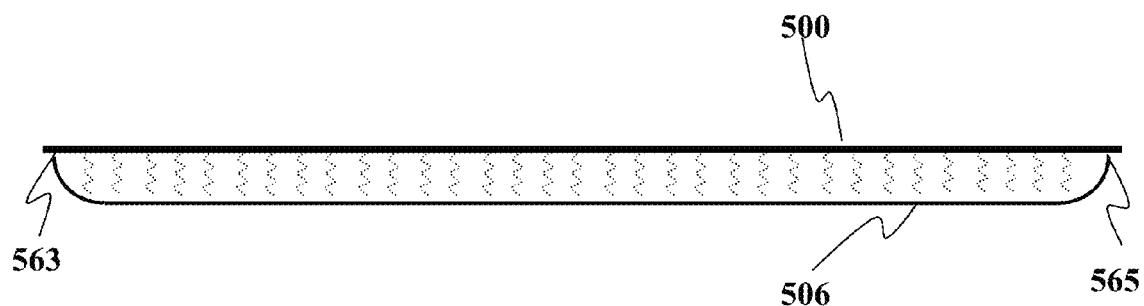
Figure 8:
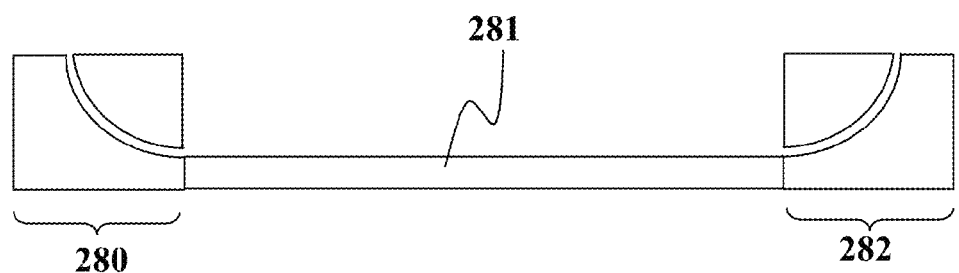
FIGS. 8 through 9B show a variety of substrate forming devices according to some embodiments of the present invention.

FIG. 7A shows that the web 506 may be curved at the edges to create a cavity between the web 506 and the carrier web 500. FIG. 7 is cross-section going across the web 506 and viewing the cross-section downweb. The speeds of the web 506 and the carrier web 500 may be synchronized so that the two webs may engage together to form a seal or substantially seal contact at locations 563 and 565. In this manner, the group VIA vapor from the carrier web 500 may be mostly trapped between the substrates. This may advantageously reduce the amount material used to provide the desired amount of group VIA vapor used for processing. It should be understood that the use of the web 506 with the curved edges may also be used for a web 506 located below the deposition system 501. Such a curved web 506 may have a configuration as shown in FIG. 7B. As seen in both FIGS. 7A and 7B, the width of carrier web 500 may be wider than the width of the web 506 when curved as shown in the FIGS. 7A and 7B. This allows for more room for the Referring now to FIG. 8, a cross-section of a guide is shown for curling the substrate 506 to have the formed edges 53 and 55. This cross-section shows that substrate 506 may be transformed from a substantially planar configuration to one with a configuration sufficient to hold fluid therebetween. Guides 280 and 282 may be provided to help curl one or more portions of the substrate or web 506. The surface 281 may be a low friction surface such as but not limited to Teflon® or similar material. Optionally, the surface 281 may be of a material that can resist the processing temperatures associated with the furnace. Optionally, a low friction surface 281 may comprise of a covering, tiles, plates, or other overlayers that are placed on top of a surface that may have a higher coefficient or friction.

Figure 9A:
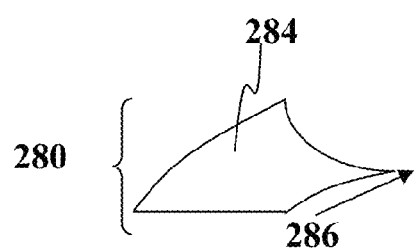

FIG. 9A shows that the surface 284 of guide 280 may be a gradually curving surface to transition the planar edge of the substrate to a curved configuration. By way of example and not limitation, the length of surface 284 as indicated by arrow 286 may be in the range from about 1 inch to about 10 inches. The greater length eases the transition from planar configuration to curved configuration. Optionally, the transition length may be in the range of about 2 to about 6 inches. In some embodiments, the transition length is determined in part by the thickness of the web, its stiffness, and the degree of desired curvature.

Figure 9B:
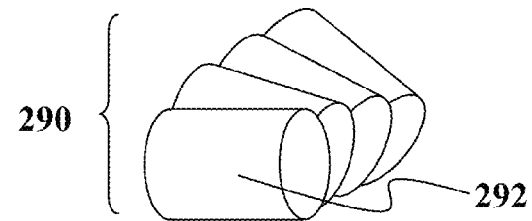

FIG. 9B shows yet another embodiment of the invention wherein the guide 290 comprises of a plurality of discrete elements 292 that are oriented to provide the same curving the substrate 506 to achieve the same functionality as that of guide 280. By way of example and not limitation, the discrete element 292 may be a roller, bearing, drum, or fixed roller. Other rotatable, fixed, or other shaped discrete elements may be used to guide the substrate 506. The guides may be any of a series of smooth surfaces, angled surfaces, rounded surfaces, the like, or combinations of the foregoing to achieved the desired configuration for substrate 506.

Figure 10A:
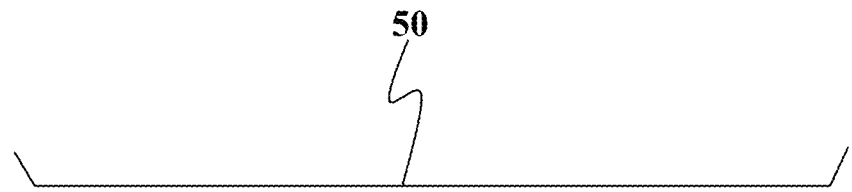
FIGS. 10A through 10C show down-web cross-sectional views of shaped substrates according to some embodiments of the present invention.
Figure 10B:
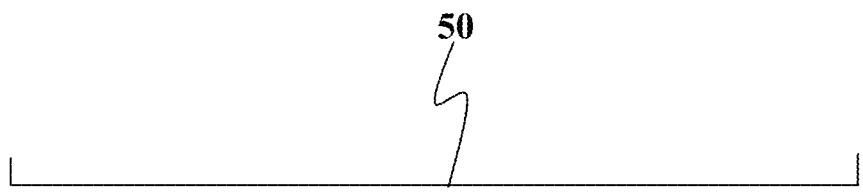
Figure 10C:
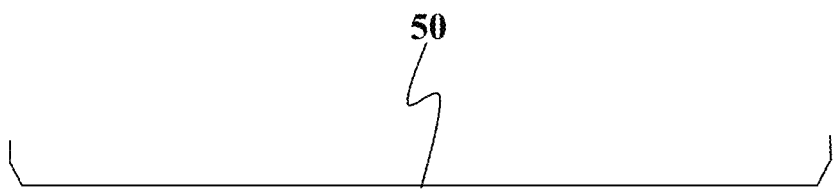

Referring now to FIGS. 10A-10C, it should be understood that the guides herein may be configured provide a variety of different geometries. FIG. 10A shows that the substrate 506 may have angled but substantially straight upward extending edge 293. FIG. 10B shows that the substrate 506 may have a vertical but substantially straight upward extending edge 295. FIG. 10C shows that the substrate 506 may have a multi-bend upward extending edge 297. It should be understood that other geometries of straight or curved sections may be combined in any order to create the desired cross-sectional profile for the substrate 506. The upward extending portion of the substrate 506 may be at any angle so long as it is sufficient to contain or constrain the fluid over the substrate 506.

Figure 11:
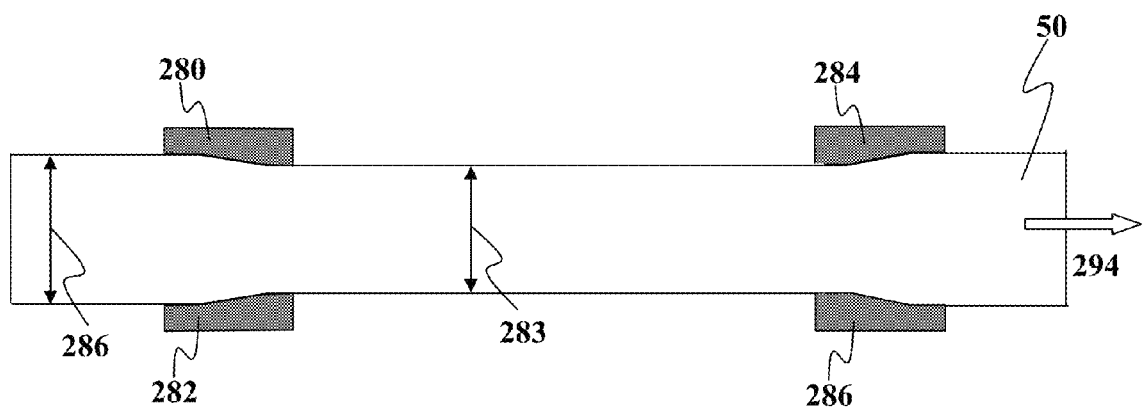
FIGS. 11 and 12 show top down views showing locations of substrate forming devices for processing systems according to some embodiments of the present invention.

FIG. 11 shows that the guides 280 and 282 may be positioned to narrow the substrate 506 to achieve the curved configuration with the curved edges 53 and 55. Guides 284 and 286 are similar to the guides 280 and 282, except that the configuration is reversed to gradually uncurl the curved portions 53 and 55 and return the substrate 506 to a substantially planar configuration. By way of example and not limitation, it is desirable that the curling and uncurling occur in a manner that does not cause substantially permanent deformation that causes warping or damage to substantial portions of the substrate 506.

FIG. 11 also shows that when the edges of the substrate 506 is configured to have curved portions 53 and 55, the width 283 of the substrate 506 is less than the width 285 of the substrate 506 when planar. The movement of the substrate 506 is in the direction as indicated by arrow 294.

Figure 12:
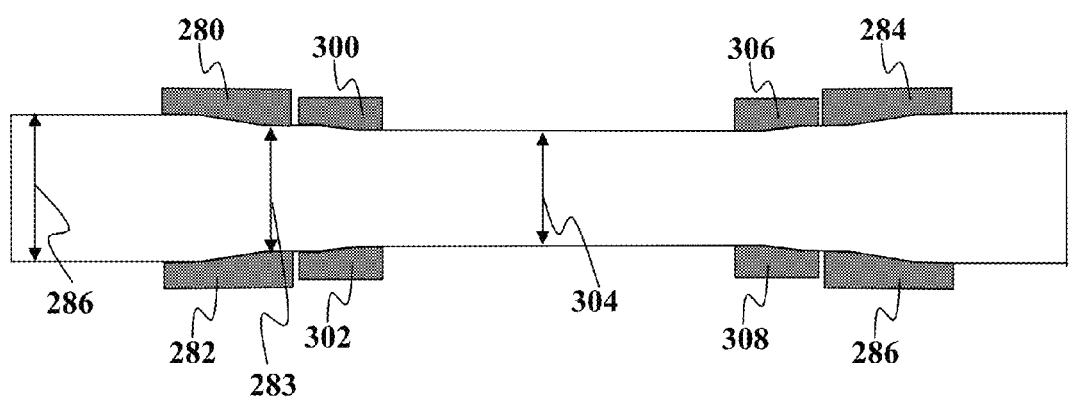

FIG. 12 shows that a cascade of one or more guides may be used to gradually curve the substrate 506. In this embodiment of the invention, the guides 280 and 282 are included. Additionally, a second set of guides 300 and 302 are included to further curl the substrate 506. This decreases the width to that indicated by arrows 304. FIG. 12 also shows the multiple guides 306, 308, 284, and 286 are used to uncurl or uncurve the substrate 506.

By way of example and not limitation, it should be understood that the heating zone 324 may use a variety of heating techniques. Some may use convection heating, infrared (IR) heating, or electromagnetic heating. Some embodiments may use chilled rollers or surfaces (not shown) on the underside of the substrate 506 to keep a lower portion of the substrate 506 cool while the upper portion is at a processing temperature. Optionally, there may be one or more separate zones in the heating zone 324. This allows for different temperature profiles during processing. In one embodiment, the heating elements may be positioned to heat all components in the heating zone to the same temperature. This includes the cover over the substrate, a muffle, or other elements used inside the heating enclosure. Again, heating may occur by convection heating, infrared (IR) heating, and/or electromagnetic heating. In one nonlimiting example, the air gap is both above and below. In another embodiment, the gap is at least 1 cm from surface of the muffle to the surface of the heater. Optionally, the gap is at least 2 cm. Optionally, the gap is at least 3 cm. Optionally, the gap is at least 4 cm. The air gap may be defined by an insulating tube (round or rectangular) around the entire muffle. The top air gap may be separate from the bottom air gap or there may be space along sides of the muffle to join the two.

Figure 13:
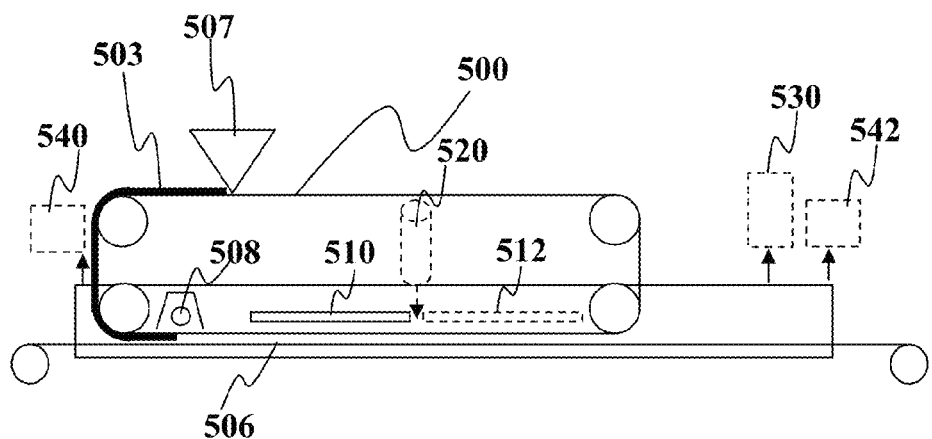
FIGS. 13 through 14 show cross-sectional views of inline roll-to-roll processing systems with multiple deposition locations according to some embodiments of the present invention.

Referring now to FIG. 13, another embodiment of the present invention is shown. This shows that the belt 500 may be elongated to provide a close proximity cover over the web 506. In some embodiments, the web 506 and belt 500 may be in contact. Another embodiment, the web 500 may be in edge contact as shown in FIGS. 7A and 7B. In one embodiment, the distance between the belt 500 to the web 506 may be in the range of about 1 mm to about 20 mm. Optionally, the distance between the belt 500 to the web 506 may be in the range of about 1 mm to about 100 mm. In one embodiment, the distance between the belt 500 to the web 506 may be in the range of about 1 mm to about 10 mm.

Figure 14:
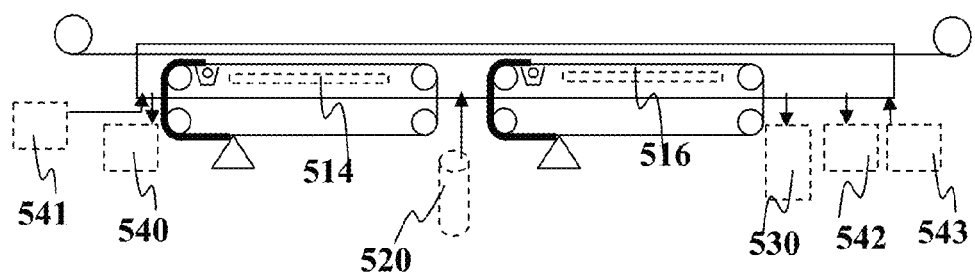

FIG. 14 shows another embodiment, wherein the precursor layer on web 506 is facing downward. The deposition systems are also located below the web 506. For this and any of the other embodiments herein, the following may also apply. The nascent absorber layer on web 506 may be annealed by flash heating it and/or the web 506 from an ambient temperature to an average plateau temperature range of between about 200° C. and about 600° C. with the heating units 510 and the like. The heating unit 510 optionally provides sufficient heat to rapidly raise the temperature of the nascent absorber layer and/or substrate 506 (or a significant portion thereof) e.g., at between about 5 C.°/sec and about 15° C.°/sec. By way of example, the heating unit may include one or more infrared (IR) lamps that provide sufficient radiant heat. In some embodiments, the heaters are located outside the walls of the furnace and they will heat the walls of the furnace and the contents inside the furnace to the processing temperature. Optionally, some embodiments may have heaters embedded in the walls of the furnace. Other embodiments, may have optionally have heaters located inside in the furnace. Some embodiments may have single or multiple combinations of the foregoing. Still further embodiments may use heated gases and convection through the furnace to assist in processing. Embodiments herein may use any of the RTP or temperature profiles set forth in copending patent application Ser. No. 11/361,498 or Ser. No. 10/943,685, both fully incorporated herein by reference for all purposes. Gas shims and other transition mechanisms such as that described in copending patent application Ser. No. 10/782,233 also fully incorporated herein by reference for all purposes.

In some embodiments of the invention, group VIA elements such as selenium or sulfur may be incorporated into the absorber layer either before or during the annealing stage. Alternatively, two or more discrete or continuous annealing stages can be sequentially carried out, in which group VIA elements such as selenium or sulfur are incorporated in a second or latter stage. The first stage may optionally be without group VIA elements. For example, the nascent absorber layer on web 506 may be exposed to $H_2Se$ gas, $H_2S$ gas or Se vapor before or during flash heating or rapid thermal processing (RTP). In this embodiment, the relative brevity of exposure allows the metal web to better withstand the presence of these gases and vapors, especially at high heat levels.

FIG. 14 also shows that in addition to or in place of gas vents 540 and 542, gas inlets from gas sources 541 and 543. The gas sources 541 and 543 may provide inert gases such nitrogen, argon, helium, or the like at positive gas pressures so that any group VIA or other process gas stays inside the furnace due the positive pressure from these gas inlets that prevents process gases from escaping except through vents such as vents 540 or condensers 530.

Figure 15:
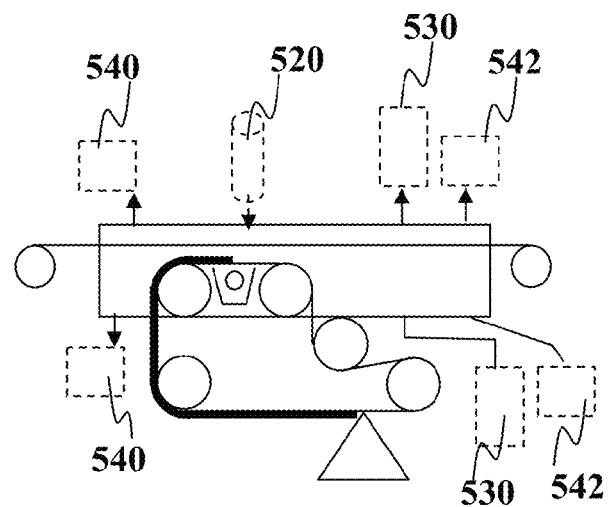
FIG. 15 shows a cross-sectional view of an inline roll-to-roll processing system according to one embodiment of the present invention.
Figure 16:
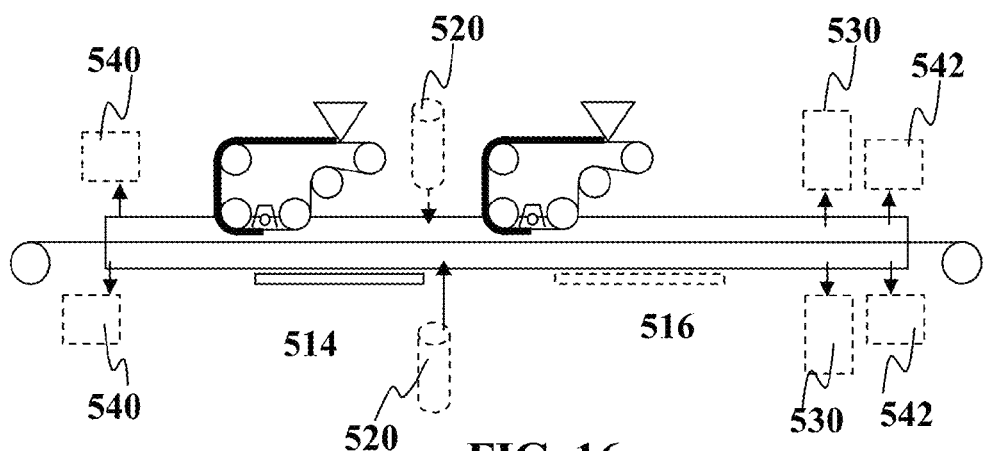
FIG. 16 shows a cross-sectional view of an inline roll-to-roll processing system with multiple deposition locations according to another embodiment of the present invention.

FIGS. 15 and 16 shows embodiments wherein the amount of belt 500 inside the furnace is minimized by adjusting the path to have a longer pathway outside the furnace, but a shortened path in the furnace. It also shows that for any of the embodiments herein, that the vents and gas sources may be both above and/or below the web.

Figure 17:
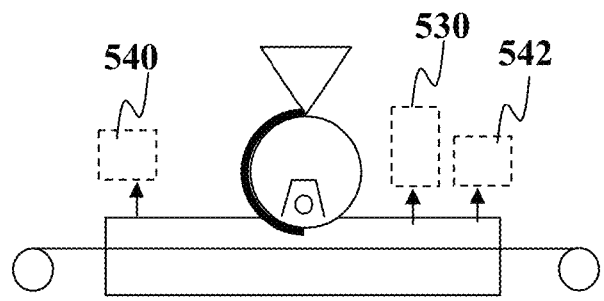
FIG. 17 shows a cross-sectional view of a roll-to-roll processing system according to one embodiment of the present invention.
Figure 18:
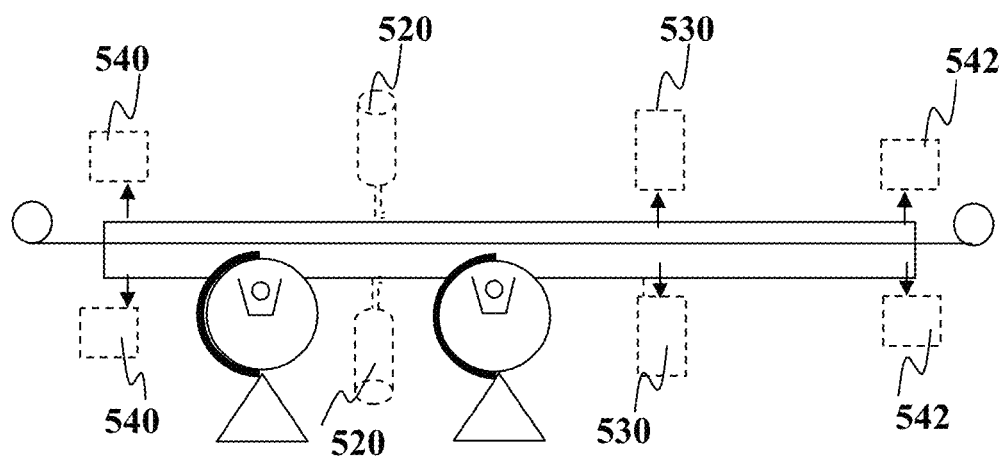
FIG. 18 shows a cross-sectional view of an inline roll-to-roll processing system with multiple deposition locations according to another embodiment of the present invention.

FIGS. 17 and 18 shows that the belt 500 may actually be a rotary drum or a circular shaped belt to add a group VIA-based material into the furnace.

Figure 19:
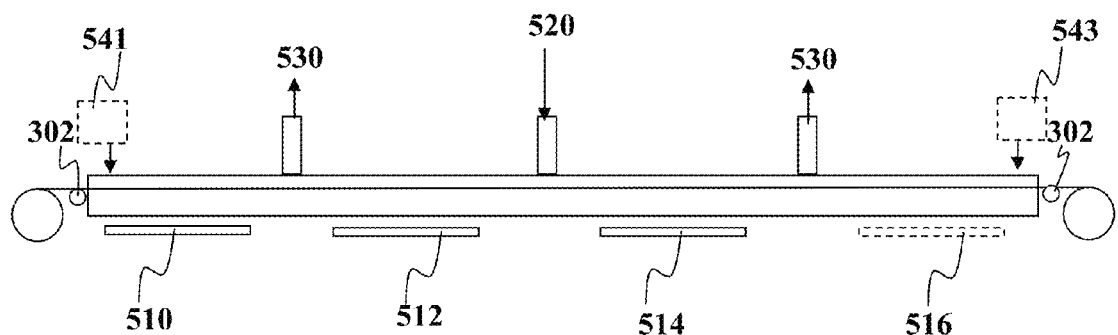
FIGS. 19 through 22 show cross-sectional view of elongate inline roll-to-roll processing systems according to embodiments of the present invention
Figure 20:
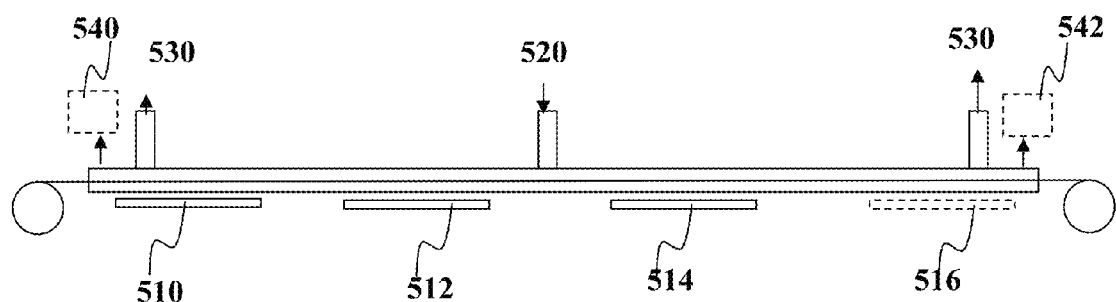
Figure 21:
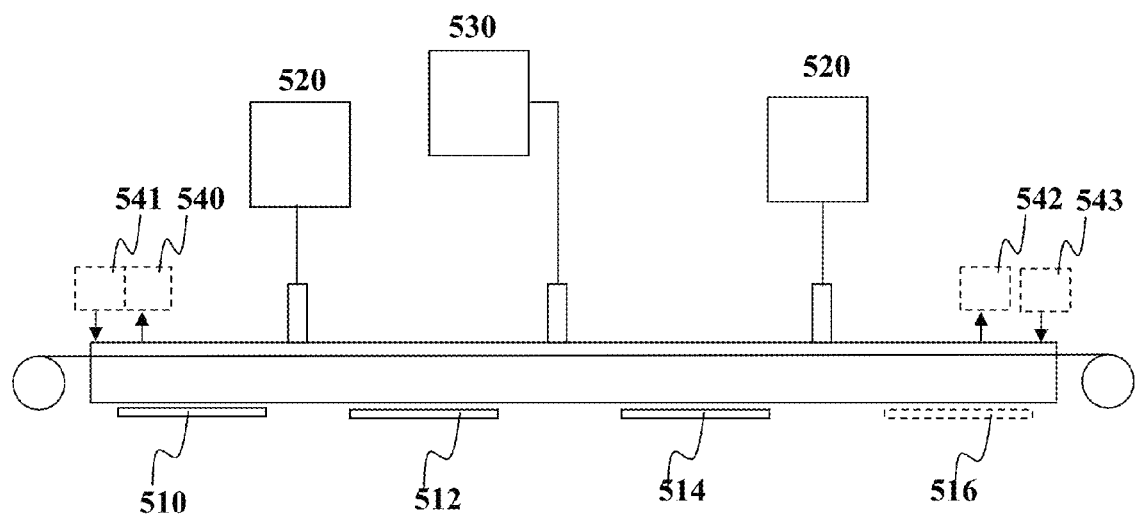

Referring now to FIG. 19-21, embodiments of a tube furnace, elongate inline roll-to-roll furnace, or muffle for RTP selenization or sulfurization is provided. Optionally this furnace may also be used for heating in non-reactive gases. Although not limited to the following, the furnace may accommodate foils from about 4 inches to about 2 meters in width. Other may use webs 506 more than about 1 meter wide. The furnace may be designed with openings sized to handle foils of such widths. In one embodiment, the openings are sized so as to provide minimal clearance above and below the foil to reduce the amount of gas escaping. In one embodiment, the amount of space above and below are less than about 3 inches. In one embodiment, the amount of space above and below are less than about 2 inches. In one embodiment, the amount of space above and below are less than about 1 inch. In one embodiment, the amount of space above and below are less than about 0.5 inches. Although not limited to the following, the ratio of the interior width to the interior height at the narrow points in the chamber may be at least 10:1. Although not limited to the following, the ratio of the interior width to the interior height at the narrow points in the chamber may be greater than 10:1. Optionally, in one embodiment of a roll-to-roll format, an RTP furnace can be affected created by using a tunnel made of thermally conductive material (graphite, metal, etc. . . . ). At the roll to roll web section enters the tunnel, it experiences a ramp rate similar to an RTP system. This change in temperature delta can optionally be increased if the roller 302 comprises of a chilled roller and is positioned just at the entrance of the tunnel to cool the web just prior to entering the tunnel, us minimizing any effect of the web conducting heat back to the section outside the tunnel. A chilled roller on either side is optional and can similarly be positioned at the exit of the tunnel to effect a fast ramp down rate.

FIG. 19 shows that there are heaters 510 positioned outside the furnace. They may located above, below, or located above and below the furnace. They may be spaced apart to create an air gap between the heater and the furnace or muffle. This may be true for any of the embodiments herein. Some areas may be heated to different temperatures. Others may have different ramp rates. A variety of sources, condenser, and/or vents previously described for any of the embodiments herein may also be used.

FIG. 20 shows a similar embodiment except that there is less space in the furnace below the web 506. The positioning of condensers 530 may also be varied.

FIG. 21 shows a still further variation wherein there are both vents and inlets at the outlets and inlets of the furnace. FIG. 21 also optionally shows that there may be reduced height portion(s) 522 built or configured for any of the embodiments herein. It may or may not coincide with where group VIA process gas is present. It may or may not coincide with where processing temperatures are highest. This may be adapted for any of the embodiments herein.

Figure 22:
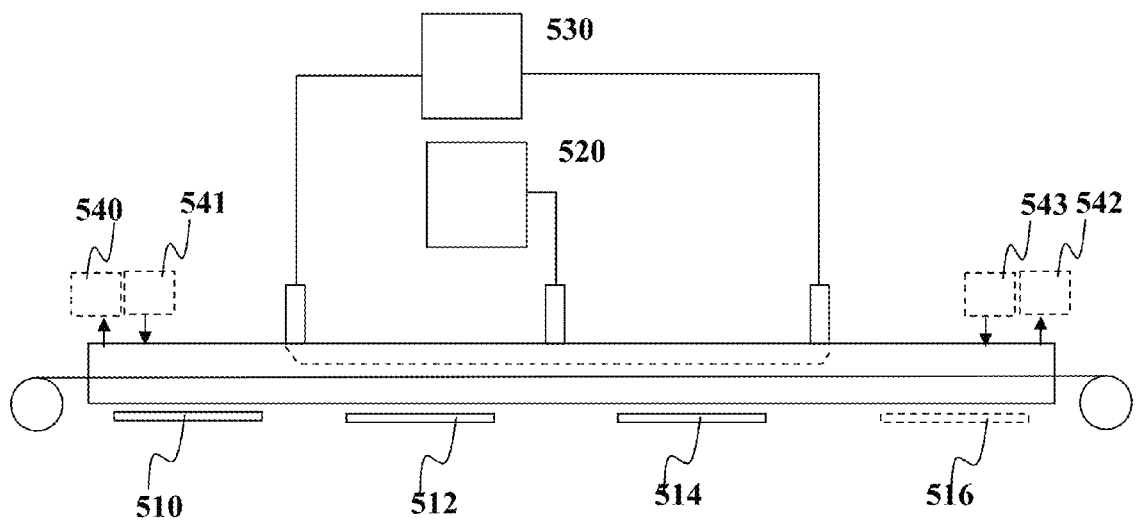

FIG. 22 shows an embodiment wherein the vents lead to a single condenser unit to recapture process gas. Filters may be positioned downstream from the condenser to further purify the gas. Some embodiments may use the recapture process gas material to make additional process gas vapor.

Figure 23:
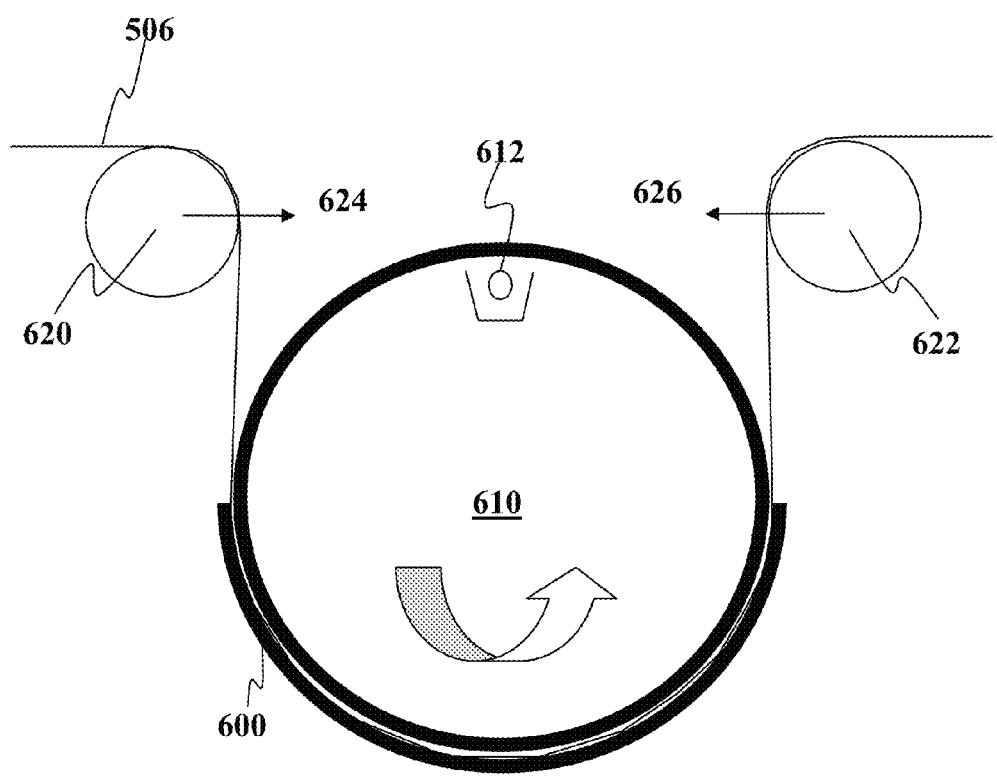
FIG. 23 shows a cross-sectional view of a curved path processing system according to one embodiment of the present invention.
Figure 24:
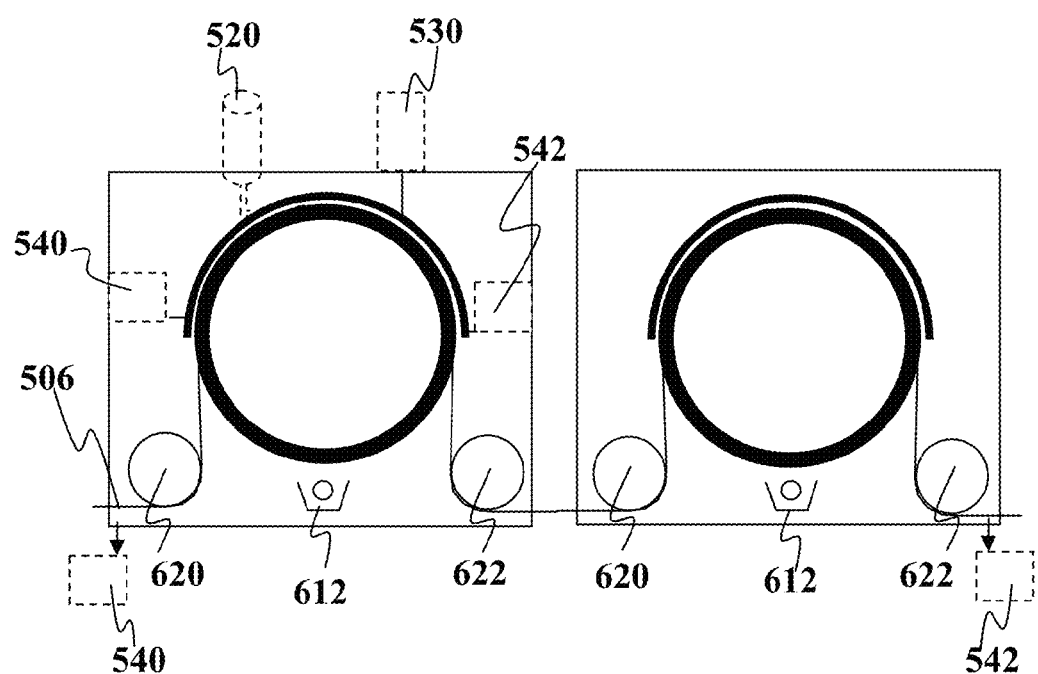
FIG. 24 shows a cross-sectional view of a curved path processing system according to another embodiment of the present invention.

FIGS. 23 and 24 show an embodiment wherein the web enters through a curved chamber 600. This may be particularly advantageous in that substrate 506 may be cooled by the drum or curved belt 610 in the sections where it may in the curved chamber 600. At location 612 any debris on the drum or belt 610 may be burned off to provide a clean surface to again engage web 506. This cooling system may allow for higher temperatures to be run in selenization, sulfidation, and/or other process gas as the substrate or web 506 is cooled by the drum, but the surface with the precursor layer may be more aggressively heated. As shown previously, various vents, condensers, and/or gas sources may be used with the curved chamber 600. The rollers 620 and 622 may be moved as necessary to increase the tension of the web against the drum or belt 610 for better thermal transfer.

FIG. 24 shows that there may be multiple curved chambers used in series. It also shows that the chambers may also allow a web 506 to pass through them wherein the downward opening C-shape of the curved chambers minimizes gas loss as the process gas tends to rise. Similar to the furnaces of FIGS. 19-22, vents and condensers may be located near the exits of the chambers and/or along the path of the web 506.

Figure 25:
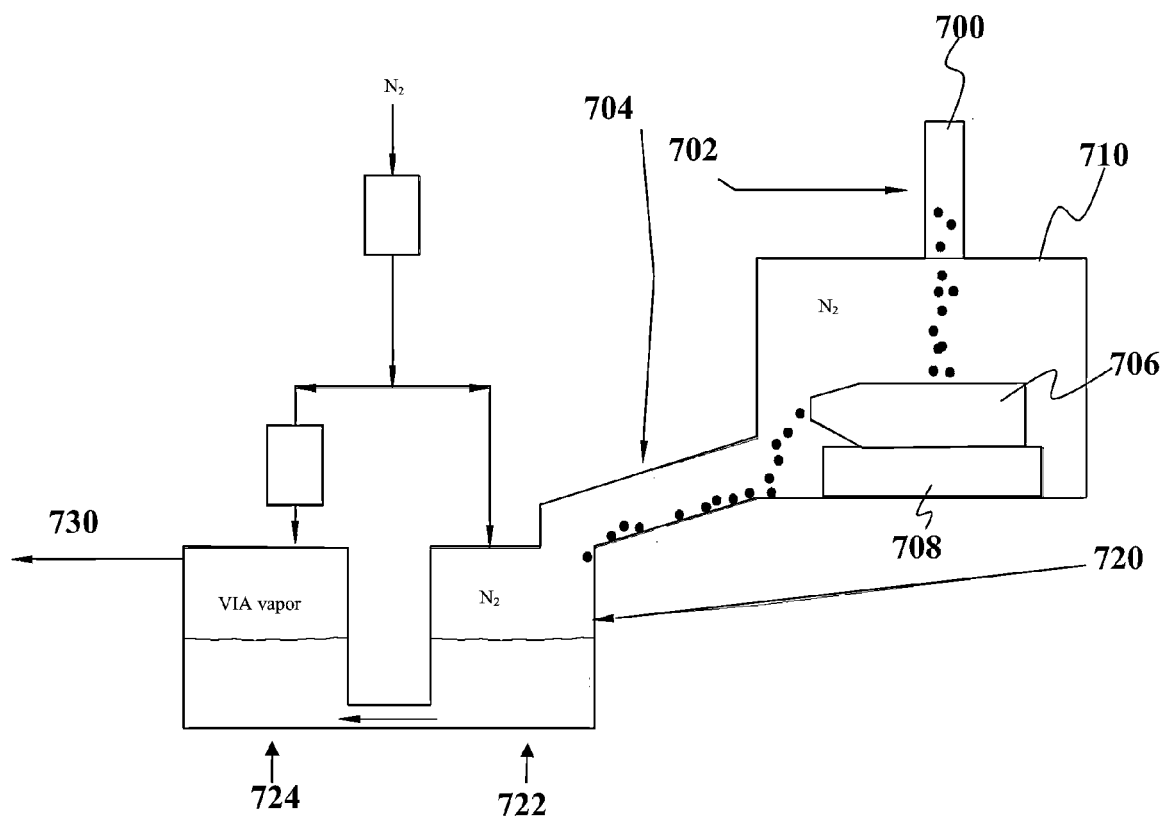
FIG. 25 shows a feed system according to one embodiment of the present invention.

FIG. 25 shows a still further embodiment wherein an automatic vapor creation system is used to allow group VIA vapor to be formed in a continuous basis without having the interrupt the system or take it offline for reloading of group VIA material. By way of nonlimiting example, the present embodiment of the system is suitable for use in sulfidation, selenization, or in creating other types of process gases. Inert gases other than nitrogen may also be used. Optionally, the chamber ways and/or gas lines leading towards or away from the group VIA vapor chamber is heated to a temperature to prevent unwanted condensation of the VIA material on non-target surfaces.

As seen in FIG. 25, a fill port 700 is included that allows for addition for feedstock material for delivery into any of the processing system discussed herein that may be attached to this automatic vapor creation system. There are valves 702 and 704 for controlling the movement of feedstock through the system. In the present embodiment, a holder/feeder 706 is mounted to receive the feed stock, weigh it, and release it based on need into the rest automatic feed system. A balance 708 may be included to maintain real-time information on the amount of material remaining in the holder/feeder 706. The chamber 710 may be gas tight and fed with a inert gas source and/or vacuum to cycle in a continual flow of inert gas into the chamber 710.

FIG. 25 shows that in this embodiment there is a multi-section vapor generator 720 which has at least one low temperature side 722 and a vapor generator side 724 that is typically but not necessarily at a higher temperature. The non-vapor generation side 722 is pre-treatment zone that may pre-heat the feedstock to liquefy it. An inert gas environment is maintained at sufficient vapor pressure over the liquid in the side 722 to prevent vapor creation from liquid in side 722. Side 722 is fluidly coupled to the vapor generator side 724. The temperature and pressure in the chamber 724 is in one embodiment sufficient to generate vapor. The temperature in the chamber 722 side is typically sufficient to generate liquid but not necessarily vapor. There may be carrier gas such as but not limited to inert gas added to the vapor generator side 724 to help carry the generator vapor towards the processing system. In some embodiments, there may be one or more intervening chambers to allow for gradual heating of the liquid feedstock material till it reaches vapor generator side 724. Optionally, there may be more than one vapor generator side/chamber 724. The inert gas may be at the same temperature or at higher temperature than the vapor in chamber 724 to prevent condensation due to lower local temperature at the gas inlet. Vapor generated by chamber 724 may be carried away by one or more heated or unheated conduits 730 towards a processing system. Heating is optionally included to prevent condensation in the pipes and may be at a temperature that is the same or higher than that of vapor.

Figure 26:
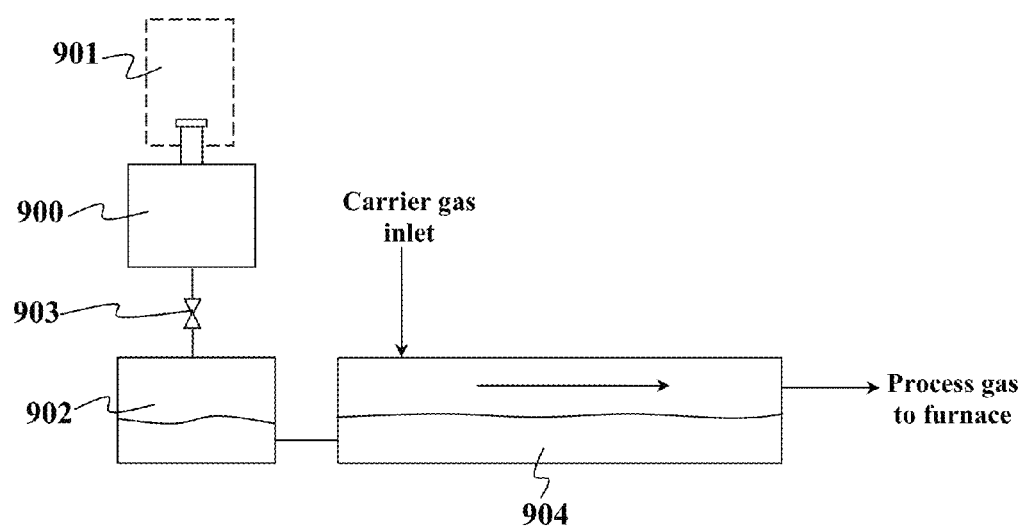
FIGS. 26 through 27 show cross-sectional schematic of various embodiments of the present invention for loading process gas material.

FIG. 26 shows yet another embodiment of the present invention. Herein, this embodiment is configured to have a plurality of cascading pots or containers. In one configuration, each can be heating (or not heating) the group VIA source material to different temperatures. This can be done in a sequentially rising temperature pattern or in other patterns as desired. The continuous operation of the furnace desires that there be no substantial change in operating temperature of the final pot 904 before delivery of group VIA gas into the furnace. Substantial change in the final pot 904 can alter processing and alter the flow of process gas into the furnace. Thus, this series of pots 900, 902, and 904 will bring fresh VIA up to temperature in manner that does not impact the pot 904 to be more than the tolerance of the process in the furnace. By way of non-limiting example, pot 900 may be unheated at certain times to allow for loading of process gas material (solid or liquid). By way of non-limiting example, pot 902 is at a temperature less than pot 904. By way of non-limiting example, pot 904 is at operating temperature to create the desired vapor of process gas.

In this embodiment, inlet pot 900 receives new group VIA source material. This inlet pot 900 may be a source container that is at an ambient temperature or lower. Some may be higher than ambient but lower than a temperature where the process gas material liquefies.

After purging with inert gas or other suitable gas, pot 900 is heated so that liquid process gas material such as but not limited to group VIA material flows through tubing or appropriate fluid pathway to pot 902, which may be heated to an intermediate temperature where the process gas is liquid. Although not limited to this embodiment, the temperature is kept sufficiently low so that process gas vapor is not being generated or not being generated in any substantial manner. This creates a pot 902 which is equalized in pressure such that liquid process gas material from pot 900 flows to pot 902. The atmosphere in pot 902 may be an inert gas, but other suitable gas may also be used alone or in combination with the inert gas.

Optionally, a temperature activated valve 903 may be used to couple pots 900 and 902 together. In one embodiment, the valve 903 is configured to open only at temperatures equal or greater than a melting temperature of the process gas material. This temperature activated valve 903 can be used to ensure that when the system is cooled, there is no back flow of gas from the pot to the external environment. Some other valves 903 can be configured to only open when certain pre-set temperatures are reached. Some may use corrosion resistant butterfly valves such as that from Tyco Valves & Controls. However, it is desirable that there is 100% certainty that a seal has been made and some types of valves such as those of FIG. 27 are superior than others for this use.

This configuration for the valve 903 provides a source of group VIA or other process gas that allows such materials to be added without disrupting continuous operation of the furnace and without disrupting the atmosphere in the furnace. When used with a cascading pot configuration, this further allows for process gas to be supplied to the furnace, even when the pot 900 is being reloaded. Some embodiments may also use a temperature activated valve between pots 902 and 904. Some embodiments may also use an enclosure 901 filled with inert gas around the inlet of pot 900. This enclosure 901 can be used to provide another stage to purge external atmosphere before material is introduced to pot 900.

Figure 27:
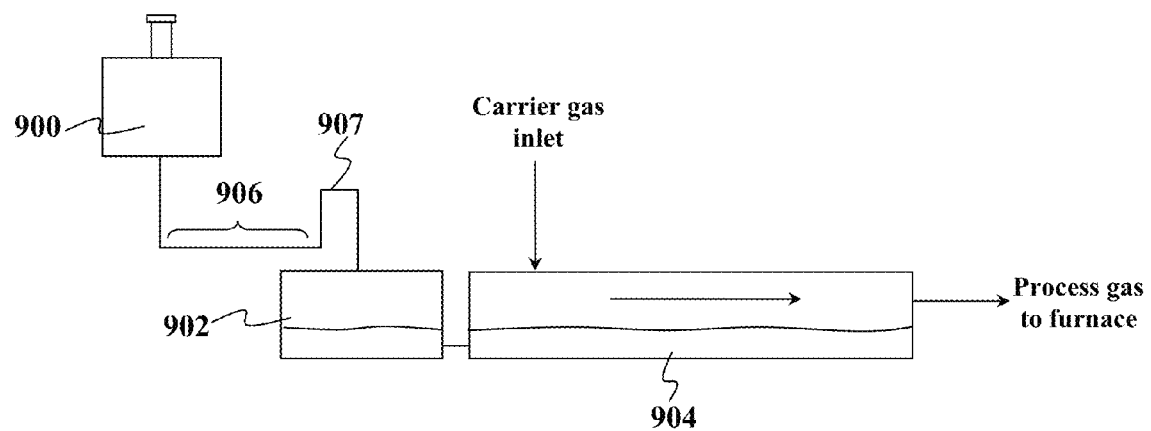

Referring now to FIG. 27, a still further embodiment of the present invention will now be described. In this particular embodiment, the process gas material is group VIA material and is in solid form when added to the top fill pot 900. This embodiment involves opening and closing a container to insert the solid material therein to the pot 900 which may be described as a source container. However, opening and closing involves compromising the environment in the furnace through exposure to outside atmosphere, which is undesirable.

This embodiment of FIG. 27 uses a trap concept with the pot 900. After delivery of material from pot 900 to pot 902, group VIA material can remain in area 906 of the tubing, where upon cooling, it solidifies to seal the pot 900 from pot 902. This allows pot 900 to be opened to external atmosphere without introduction of contaminants to the pot 902 or allow pressurized gas from pot 902 from escaping outward into the atmosphere. The portion 906 has heaters and/or cooler that allow this section to be heated and cooled to seal and unseal the tube.

In one particular example, the material used in the pot 900 is selenium. As selenium pellets melts, due to gravity it will flow down. Once empty, the fluid will reach a certain level in the pathway, such as in portion 906. A second portion 907 is shaped to help retain liquid in portion 906. Then it is cooled to solidify in the shaped pipe below the container. By solidifying, it closes the pipe. By way of limiting example, the second portion 907 can be configured through its angle, shape, and/or sizing to help retain a portion of the material in portion 906 to form the seal. Other methods of retaining material to be hardened to form a seal in the pathway can also be used and the present embodiment is not limited to only the configuration shown herein.

In one embodiment, the method comprises opening the source container or pot 900, inserting selenium pellets, closing, purging (to get oxygen and external atmosphere out). The pot 900 and/or the fluid pathway exiting the pot 900 can be heated, then another flush, cool down, solidify in the pipe to create a seal in the pipe, etc. . . . The flush can be by use of gas pressure in pot 900 to assist liquid flow. Optionally, some embodiments rely solely on gravity to ensure that some material remains in the trap portion 906.

The process gas material in the trap portion 906 is configured not to pick up contaminants. In one embodiment, stainless steel piping is used such that it does not corrode. In one embodiment, the length of solidified material in the pathway is about 12 inches. A sharp corner can work too to create the seal. Some embodiments may use a valve where the group VIA material solidifies in the valve. The valve is heated and then the VIA material is liquefied. FIG. 27 uses a liquid trap system that does not need mechanical valve to create a seal. Optionally, some embodiments can use both. Some embodiment Optionally, some embodiments may use a second material that is used to solidify in the pathway. This may be another material in the same elemental group such as group VIA material. In one embodiment, this may be a material that has a lower melting temperature. Optionally, this may be a material that has a higher melting temperature.

In the embodiment of FIG. 26, there may also be heaters and coolers there to assist in the sealing in that embodiment near portion 906.

Expansion tubing may also be included to absorb mechanical stress between heating of the furnace and the heating of pot 904. Any temperature cycling between the two can cause changes in the size of those elements and the expansion tubing can account for those changes while maintaining a leak free path between furnace and the heating of pot 904.

While the invention has been described and illustrated with reference to certain particular embodiments thereof, those skilled in the art will appreciate that various adaptations, changes, modifications, substitutions, deletions, or additions of procedures and protocols may be made without departing from the spirit and scope of the invention. For example, with any of the above embodiments, it should be understood that any of the above particles may be spherical, spheroidal, or other shaped. For any of the above embodiments, it should be understood that the use of core-shell particles and printed layers of a chalcogen source may be combined as desired to provide excess amounts of chalcogen. The layer of the chalcogen source may be above, below, or mixed with the layer containing the core-shell particles. With any of the above embodiments, it should be understood that chalcogen such as but not limited to selenium may added to, on top of, or below an elemental and non-chalcogen alloy precursor layer. Optionally, the materials in this precursor layer are oxygen-free or substantially oxygen free. In one embodiment, the material used for the furnace or other components that may be exposed to group VIA materials at high temperatures may be resistant to corrosion such as but not limited to ceramics, alumina, tantalum oxide, titania, zirconia, glass, quartz, stainless steel, graphite, refractory metals, Ta, refractory metal nitrides and/or carbides such as Ta-nitride and/or carbide, Ti-nitride and/or carbide, W-nitride and/or carbide, other nitrides and/or carbides such as Si-nitride and/or carbide. Any of the foregoing may arrange the furnaces the transport the web in a vertical or other angled direct and not necessarily in a horizontal manner. For example, instead of being horizontal, the elongate furnaces may be placed vertically and the substrate may travel through them in a vertical manner.

Furthermore, those of skill in the art will recognize that any of the embodiments of the present invention can be applied to almost any type of solar cell material and/or architecture. For example, the absorber layer in solar cell 10 may be an absorber layer comprised of silicon, amorphous silicon, Cu—In, In—Ga, Cu—Ga, Cu—In—Ga, Cu—In—Ga—S, Cu—In—Ga—Se, other absorber materials, II-VI materials, IB-VI materials, CuZnTe, CuTe, ZnTe, IB-IIB-IVA-VIA absorbers, or other alloys, and/or combinations of the above, where the active materials are present in any of several forms including but not limited to bulk materials, micro-particles, nano-particles, or quantum dots. The CIGS cells may be formed by vacuum or non-vacuum processes. The processes may be one stage, two stage, or multi-stage CIGS processing techniques. Additionally, other possible absorber layers may be based on amorphous silicon (doped or undoped), a nano-structured layer having an inorganic porous semiconductor template with pores filled by an organic semiconductor material (see e.g., US Patent Application Publication US 2005-0121068 A1, which is incorporated herein by reference), a polymer/blend cell architecture, organic dyes, and/or $C_{60}$ molecules, and/or other small molecules, micro-crystalline silicon cell architecture, randomly placed nanorods and/or tetrapods of inorganic materials dispersed in an organic matrix, quantum dot-based cells, or combinations of the above. Many of these types of cells can be fabricated on flexible substrates.

Additionally, concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a size range of about 1 nm to about 200 nm should be interpreted to include not only the explicitly recited limits of about 1 nm and about 200 nm, but also to include individual sizes such as 2 nm, 3 nm, 4 nm, and sub-ranges such as 10 nm to 50 nm, 20 nm to 100 nm, etc. . . .

The publications discussed or cited herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed. All publications mentioned herein are incorporated herein by reference to disclose and describe the structures and/or methods in connection with which the publications are cited. The following applications are fully incorporated herein by reference for all purposes: Ser. No. 11/290,633 entitled "CHALCOGENIDE SOLAR CELLS" filed Nov. 29, 2005 and Ser. No. 10/782,017, entitled "SOLUTION-BASED FABRICATION OF PHOTOVOLTAIC CELL" filed Feb. 19, 2004 and published as U.S. patent application publication 20050183767, the entire disclosures of which are incorporated herein by reference, U.S. patent application Ser. No. 10/943,657, entitled "COATED NANOPARTICLES AND QUANTUM DOTS FOR SOLUTION-BASED FABRICATION OF PHOTOVOLTAIC CELLS" filed Sep. 18, 2004, U.S. patent application Ser. No. 11/081,163, entitled "METALLIC DISPERSION", filed Mar. 16, 2005, U.S. patent application Ser. No. 10/943,685, entitled "FORMATION OF CIGS ABSORBER LAYERS ON FOIL SUBSTRATES", filed Sep. 18, 2004, and U.S. Application Ser. No. 61/012,020 filed Dec. 6, 2007.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A thin-film absorber formation method comprising:
   operating a furnace having an internal atmosphere containing a process gas;
   loading process gas material into a source container that is part of a system configured to provide process gas to the furnace,
   wherein loading of the source container occurs without exposing the internal atmosphere of the furnace to external atmosphere present in the source container by solidifying process gas material to form a gas tight seal to separate the source container from the furnace, wherein the seal is formed before the source container is opened for loading and external atmosphere enters the source container,
   the system comprising a shaped pathway configured to retain process gas material in a section of the pathway to solidify and create the seal.

2. The method of claim 1 comprising:
   purging the external atmosphere from the source container;
   liquefying the process gas material forming the gas tight seal to re-open a fluid pathway leading to the furnace.

3. The method of claim 1 wherein the process gas material is in solid form when loaded into the source container.

4. The method of claim 1 wherein the source container is coupled to a system that converts process gas material to a vapor which is then transported to the furnace.

5. The method of claim 1 comprising continuing to process a workpiece in the furnace while simultaneously loading process gas material into the source container, wherein such loading of the source container does not interrupt the furnace from processing the work piece.

6. The method of claim 1 comprising retaining process gas material in a trap portion downstream from the source container to form the seal when the process gas material is solidified.

7. The method of claim 1 wherein the process gas material solidified in the pathway has an effective amount of pathway-to-solid material contact surface to form a gas tight seal.

8. The method of claim 1 wherein the source container includes heaters for liquefying the process gas material.

9. The method of claim 1 wherein the process gas is corrosive to polymers.

10. The method of claim 1 comprising forming the gas seal without using any other means, except for solidifying process gas material in a fluid pathway leading away from the source container.

11. The method of claim 1 comprising forming the gas seal without using a mechanical valve.

12. A thin-film absorber formation method comprising:
    operating a furnace having an internal atmosphere containing a process gas;
    loading process gas material into a source container that is part of a system configured to provide process gas to the furnace,
    wherein loading of the source container occurs without exposing the internal atmosphere of the furnace to external atmosphere present in the source container by solidifying process gas material to form a gas tight seal to separate the source container from the furnace, wherein the seal is formed before the source container is opened for loading and external atmosphere enters the source container; and
    flowing material downward from the source container into a pathway having a first portion and a second portion, wherein the second portion is configure to provide resistance to flow out from the first portion, thus retaining process gas material in the first portion to solidify and form the seal.

13. The method of claim 12 wherein the second portion is angled to direct flow against gravity.

14. The method of claim 12 wherein the second portion is shaped to retain process gas material in the first portion.

15. A thin-film absorber formation method comprising:
    operating a furnace having an internal atmosphere containing a process gas;
    loading process gas material into a source container that is part of a system configured to provide process gas to the furnace,
    wherein loading of the source container occurs without exposing the internal atmosphere of the furnace to external atmosphere present in the source container by solidifying process gas material to form a gas tight seal to separate the source container from the furnace, wherein the seal is formed before the source container is opened for loading and external atmosphere enters the source container,
    where the source container further comprising heaters in downstream pathway for liquefying the process gas material forming the gas tight seal to re-open a fluid pathway leading away from the source container.

* * * * *